(12) United States Patent
Maekawa

(10) Patent No.: US 11,152,342 B2
(45) Date of Patent: *Oct. 19, 2021

(54) RECEIVER OPTICAL MODULE AND PROCESS OF ASSEMBLING THE SAME

(71) Applicant: SUMITOMO ELECTRIC DEVICE INNOVATIONS, INC., Yokohama (JP)

(72) Inventor: Kyohei Maekawa, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/915,154

(22) Filed: Jun. 29, 2020

(65) Prior Publication Data
US 2020/0328199 A1    Oct. 15, 2020

Related U.S. Application Data

(63) Continuation of application No. 16/171,538, filed on Oct. 26, 2018, now Pat. No. 10,734,369.

(30) Foreign Application Priority Data

Oct. 27, 2017    (JP) .............................. JP2017-208479
Mar. 22, 2018    (JP) .............................. JP2018-054404

(51) Int. Cl.
*H01L 31/02*    (2006.01)
*H01L 25/16*    (2006.01)
(Continued)

(52) U.S. Cl.
CPC .............. *H01L 25/167* (2013.01); *G02B 6/42* (2013.01); *G02B 6/4201* (2013.01); *H01L 24/06* (2013.01);
(Continued)

(58) Field of Classification Search
CPC ......... H01L 24/32; H01L 24/48; H01L 24/83; H01L 24/85; H01L 25/06; H01L 25/167;
(Continued)

(56) References Cited

U.S. PATENT DOCUMENTS 10,734,369 B2 *  8/2020  Maekawa ............. H01L 25/167
2002/0181853 A1 * 12/2002  Ido ....................... G02B 6/4285
                                                       385/19
(Continued)

FOREIGN PATENT DOCUMENTS

JP            3623144 B2      2/2005
JP         2005-294429 A     10/2005
(Continued)

*Primary Examiner* — Fazli Erdem
(74) *Attorney, Agent, or Firm* — Baker Botts L.L.P.; Michael A. Sartori

(57)    ABSTRACT

A receiver optical module that receives an optical signal and generating an electrical signal corresponding to the optical signal is disclosed. The module includes a photodiode (PD), a sub-mount, a pre-amplifier, and a stem. The sub-mount, which is made of insulating material, mounts the PD thereon. The pre-amplifier, which receives the photocurrent generated by the PD, mounts the PD through the sub-mount with an adhesive. The pre-amplifier generates an electrical signal corresponding to the photocurrent and has signal pads and other pads. The stem, which mounts the pre-amplifier, provides lead terminals wire-bonded with the signal pads of the pre-amplifier. The signal pads make distances against the sub-mount that are greater than distances from the other pads to the sub-mount.

16 Claims, 21 Drawing Sheets

(51) Int. Cl.
*H01L 23/00* (2006.01)
*H01L 31/0232* (2014.01)
*G02B 6/42* (2006.01)
*H01L 31/0203* (2014.01)

(52) U.S. Cl.
CPC .............. *H01L 24/32* (2013.01); *H01L 24/48* (2013.01); *H01L 24/83* (2013.01); *H01L 24/85* (2013.01); *H01L 31/0203* (2013.01); *H01L 31/02005* (2013.01); *H01L 31/02019* (2013.01); *H01L 31/02325* (2013.01); H01L 24/49 (2013.01); H01L 24/73 (2013.01); H01L 2224/05554 (2013.01); H01L 2224/32225 (2013.01); H01L 2224/4845 (2013.01); H01L 2224/48091 (2013.01); H01L 2224/48106 (2013.01); H01L 2224/48145 (2013.01); H01L 2224/48195 (2013.01); H01L 2224/48227 (2013.01); H01L 2224/48463 (2013.01); H01L 2224/48465 (2013.01); H01L 2224/48471 (2013.01); H01L 2224/48479 (2013.01); H01L 2224/4917 (2013.01); H01L 2224/49111 (2013.01); H01L 2224/49113 (2013.01); H01L 2224/49171 (2013.01); H01L 2224/73215 (2013.01); H01L 2224/73265 (2013.01); H01L 2224/83874 (2013.01); H01L 2924/00014 (2013.01); H01L 2924/10155 (2013.01); H01L 2924/12043 (2013.01); *H01L 2924/14* (2013.01); *H01L 2924/15162* (2013.01); *H01L 2924/19105* (2013.01); *H01L 2924/19107* (2013.01)

(58) Field of Classification Search
CPC . H01L 31/02; H01L 31/0201; H01L 31/0203; H01L 31/02005; H01L 31/02325
USPC .......................................................... 257/432
See application file for complete search history.

(56) References Cited

U.S. PATENT DOCUMENTS

| | | | |
|---|---|---|---|
| 2007/0069231 A1* | 3/2007 | Namioka | H01L 33/642 257/99 |
| 2010/0148041 A1 | 6/2010 | Takamatsu et al. | |
| 2010/0178061 A1* | 7/2010 | Tawa | H04B 10/40 398/139 |
| 2013/0161497 A1* | 6/2013 | Sasada | H01L 31/0232 250/227.23 |
| 2017/0097478 A1* | 4/2017 | Oomori | H01L 31/02 |

FOREIGN PATENT DOCUMENTS

| | | |
|---|---|---|
| JP | 2013-187231 A | 9/2013 |
| JP | 2014-192510 A | 10/2014 |

\* cited by examiner

US 11,152,342 B2

RECEIVER OPTICAL MODULE AND PROCESS OF ASSEMBLING THE SAME

CROSS REFERENCE TO RELATED APPLICATION

This application claims the priority benefit of Japanese Applications, JP2017-208479 filed on Oct. 27, 2017, and JP2018-054404 filed on Mar. 22, 2018, the disclosures of which are hereby incorporated by reference in its entirety.

TECHNICAL FIELD

1. Field of Invention

The present invention relates to a receiver optical module and a process of assembling the same.

BACKGROUND

2. Related Background Arts

A Japanese Patent No. 3623144 has disclosed a receiver optical module having a package of, what is called, co-axial type. The receiver optical module disclosed therein provides a photodiode (PD) and a pre-amplifier each mounted on a stem of the package. The PD and the pre-amplifier are electrically connected with respective lead pins secured in the stem via bonding wires.

In such a receiver optical module, the stem sometimes has a restricted area for mounting optical and electrical components thereon. In particular, recent pre-amplifiers expand dimensions thereof as increasing functions requested thereto, which further restrict to mount such pre-amplifiers on the stem. When a PD is offset from an optical position on the stem, the PDs may degrade sensitivity thereof.

SUMMARY

An aspect of a present invention relates to a receiver optical module that receives an optical signal and generating an electrical signal corresponding to the optical signal. The receiver optical module comprises a photodiode (PD), a sub-mount, a pre-amplifier, and a stem. The PD receives the optical signal and generates a photocurrent corresponding to the optical signal. The sub-mount, which may be made of insulating material, mounts the PD thereon and provides an interconnection that carries the photocurrent thereon. The pre-amplifier receives the photocurrent and generates the electrical signal. The pre-amplifier mounts the sub-mount accompanying with the PD thereon with an adhesive and has a signal pad and other pads, where the signal pad is electrically connected with the interconnection of the sub-mount. The stem, which mounts the pre-amplifier accompanying with the sub-mount and the PD thereon, provides a lead terminal electrically connected with the pre-amplifier, where the electrical signal is externally output through the lead terminal. A feature of the receiver optical module of the invention is that the signal pad of the pre-amplifier makes a distance against the sub-mount that is greater than distances from the other pads of the pre-amplifier to the sub-mount.

Another aspect of the present invention relates to a process of assembling the receiver optical module. The process includes steps of: (a) mounting a pre-amplifier and electrical components on a stem that provides lead terminals; (b) wire-bonding the pre-amplifier and the electrical components with the lead terminals; (c) mounting a photodiode (PD) mounted on a sub-mount on the pre-amplifier with adhesive, where the sub-mount has interconnections electrically connected with the PD; and (d) wire-bonding the interconnections on the sub-mount with the pre-amplifier.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, embodiment according to the present invention will be described as referring to accompanying drawings. The present invention, however, is not restricted to the embodiment and has a scope defined in claims attached hereto and all changes and/or modifications with the scope and equivalent there to. In the description of the drawings, numerals or symbols same with or similar to each other will refer to elements same with or similar to each other without overlapping explanations.

First Embodiment

Figure 1:
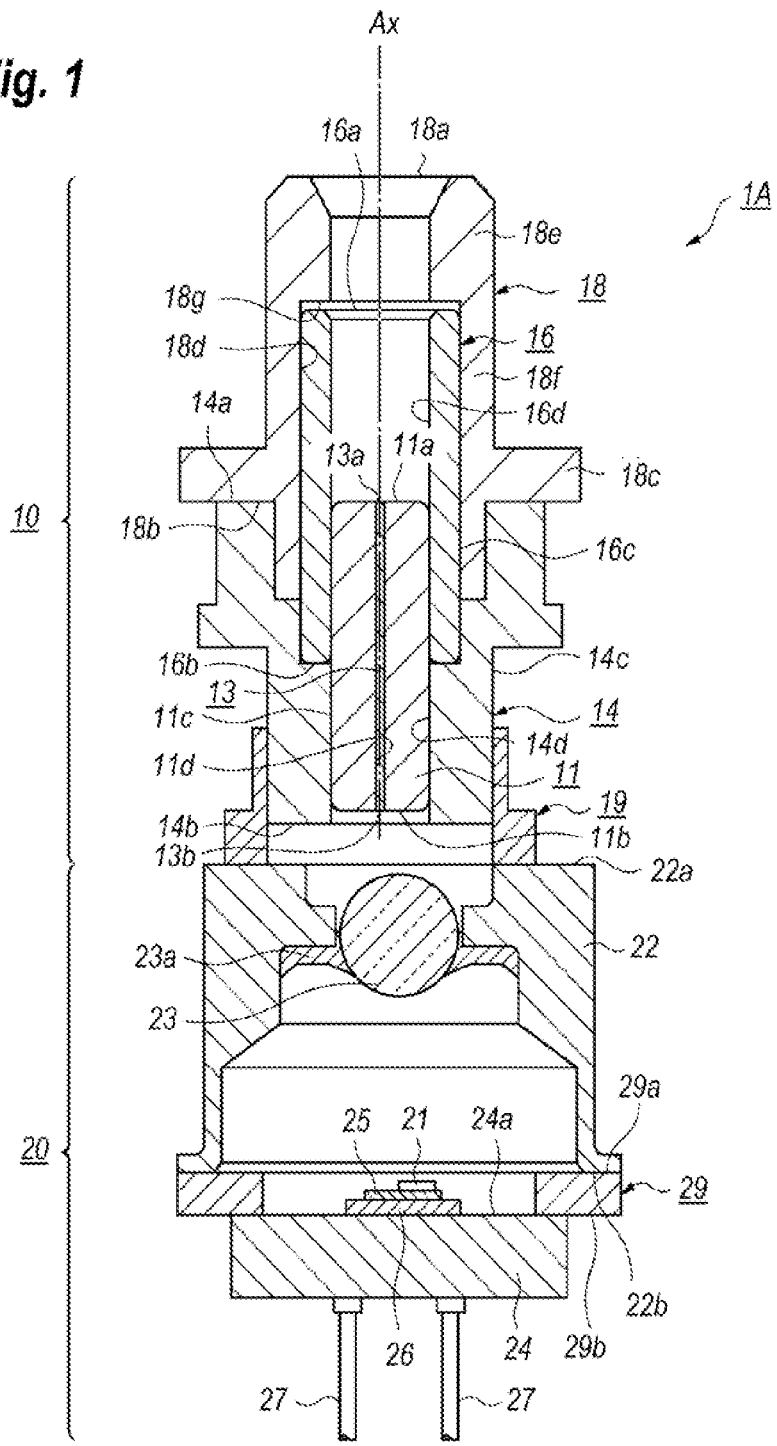
FIG. 1 is a cross sectional view of a receiver optical module according to embodiment of the present invention, which is taken along an axis Ax of the receptacle.

FIG. 1 is a cross sectional view of a receiver optical module 1A according to embodiment of the present invention, which is taken along an axis Ax of the receptacle 10. As shown in FIG. 1, the receiver optical module 1A includes a receptacle 10 and an optical device 20, where the receptacle 10 receives an external fiber therein, while, the optical device 20 is fixed thereto. The receptacle 10 includes a stub 11, a bush 14, a sleeve 16, and a shell 18. The stub 11 includes a coupling fiber 13 in a center thereof.

The stub 11, which has a column shape extending along the axis Ax of the receptacle 10, provides a front end 11a and a rear end 11b. In the description below, directions of "front", "top", "primary" and/or "forward" corresponds to a side of the receptacle 10 with respect to the optical device 20, while, another direction of "rear", "bottom" and/or "back" is a side of the optical device 20 with respect to the receptacle 10. However, those definitions of the directions are merely for explanation sake and could not restrict the scope of the present invention. The front end 11a, which makes a physical contact against a ferrule secured in a tip of the external optical fiber, is processed in convex. The rear end 11b, which faces the optical device 20, is inclined with respect to the axis Ax of the receptacle 10, for instance, around 8°. The stub 11 further provides an outer surface 11c and a bore 11d with a diameter slightly greater than a diameter of the coupling fiber 13, where the bore 11d extending from the front end 11a to the rear end 11b along the axis Ax of the receptacle 10. The stub 11 may be made of ceramics, such as zirconia ($ZrO_2$), with substantial bulk modulus to secure the physical contact against the ferrule of the external fiber.

The coupling fiber 13, which may be a type of single mode fiber (SMF) made of silica without any sheath, extends along the axis Ax and has a front end 13a and a rear end 13b. The coupling fiber 13 is secured within the bore 11d of the stub 11 exposing the front end 13a thereof in the front end 11a of the stub 11 to make the physical contact against the tip of the ferrule of the external fiber, while, the rear end 13b is exposed in the rear end 11b of the stub 11 to couple optically with the a photodiode (PD) 21 in the optical device 20. The coupling fiber 13 has an outer diameter of, for instance, 125 μm.

The bush 14, which has a cylindrical shape with a bore 14d having a circular cross section, within which the stub 11 is secured, may be made of metal, typically stainless steel. The bush 14 provides a front end 14a, a rear end 14b, and an outer surface 14c. The bore 14d extends from the front end 14a to the rear end 14b. The rear end 14b faces the optical device 20. The stub 11 is press-fitted within the bore 14d of the bush 14, that is, the outer surface 11c of the stub 11 is in tightly contact with a surface of the bore 14d of the bush 14 to hold the stub 11 by the bush 14.

The sleeve 16, which also has a cylindrical shape with a bore 16b and extends along the axis Ax, may be made of ceramic, for instance, zirconia ($ZrO_2$) same with the stub 11. The sleeve 16 provides a front end 16a, a rear end 16b, an outer surface 16c and the bore 16d with a diameter substantially equal to an outer diameter of the stub 11. The sleeve 16 in the bore 16d thereof receives the stub 11 from the rear end 16b. That is, the sleeve 16 in a rear side thereof is put between the outer surface 11c of the stub 11 and the bush 14, by which the outer surface 16c is in tightly contact with the bush 14; while, the bore 16d in a surface thereof is in contact with the outer surface 11c of the stub 11. Also, the sleeve 16 in a side of the front end 16a thereof receives the ferrule secured in the external fiber, where the tip of the external ferrule is in physical contact with the front end 11a of the stub 11, that is, the end of the coupling fiber 13.

The shell 18, which is secured with the bush 14 and to be coupled with an optical connector that secures the external fiber, has a cylindrical shape extending along the axis Ax and may be made of metal, such as stainless steel. The shell 18 includes a front end 18a, a rear end 18b, a flange 18c, and a bore 18d. The flange 18c, which is a disk shape protruding from the outer surface of the shell 18, is slightly offset toward the optical device 20 and provides the rear end 18b abutting against the front end 14a of the bush 14; thus, the rear end 18b of the shell 18 becomes a reference surface. The bore 18d, which pierces the shell 18 from the front end 18a to a rear, has a circular cross section with a center aligned with the center of the stub 11 and with the center of the bush 14. The shell 18 may be divided into two portions, that is, a front portion 18e and a rear portion 18f, where those two portions are connected at the front end 16a of the sleeve 16. The rear portion 18f has the bore 18d with a diameter equal to or slightly greater than a diameter of the front portion 18e but slightly greater than an outer diameter of the sleeve 16. Thus, the shell 18 in an inner surface thereof forms a step 18g between the front portion 18e and the rear portion 18f, where the step 18g faces the front end 16a of the sleeve 16.

The optical device 20 includes a photodiode 21 (PD), a cap 22, a lens 23, a stem 24, a sub-mount 25, a pre-amplifier 26, and lead terminals 27. The stem 24, which may be made of insulating material with a disk shape, has a primary surface 24a intersecting the axis Ax, preferably perpendicular thereto. The cap 22 may be made of metal and has a cylindrical shape with a center extending along the axis Ax, a front end 22a and a rear end 22b. The rear end 22b of the cap 22 is fixed to the primary surface 24a of the stem 24 through a doughnut bush 29. Specifically, the doughnut bush 29 provides a front surface 29a and a rear surface 29b, where the front surface 29a thereof fixes the cap 22 thereto, while, the rear surface 29b thereof is fixed to the primary surface 24a of the stem 24. The front end 22a of the cap 22 mounts the receptacle 10 through a joint sleeve 19 that has also a cylindrical shape. Specifically, the receptacle 10 is inserted within a bore of the joint sleeve 19 from a front end thereof where the outer surface 14c of the bush 14 in the rear portion thereof is in contact with the surface of the bore of the joint sleeve 19. The front end 22a of the cap 22, which is formed flat, mounts a rear end of the joint sleeve 19, specifically, the joint sleeve 19 in the rear end thereof is movable on the front end 22a of the cap 22. The cap 22 may be made of, for instance Kovar that is alloy of iron and nickel.

The lead terminals 27 pierce the stem 24 and protrude from the stem 24 along the axis Ax. The PD 21 and the pre-amplifier 26 may electrically communicate with external apparatuses through the lead terminals 27. Specifically, signals generated by the PD 21 and processed by the pre-amplifier 26 are extracted through the lead terminals 27, while, the PD 21 and the pre-amplifier 26 are supplied with biases through the lead terminals 27.

The lens 23, which is fixed to an inner surface of the cap 22 with resin 23a, is a type of concentrating lens to concentrate light output from the rear end 13b of the coupling fiber 13 onto the PD 21. The lens 23 in an optical axis thereof is offset from the axis Ax of the coupling fiber 13, namely, the axis of the receptacle 10, in order to prevent light from returning the coupling fiber 13, that the light emitted from the coupling fiber 13, and reflected at a surface of the PD 21 is prevented from entering again within the coupling fiber 13 from the rear end 13b thereof.

The PD 21, which is optically coupled with the rear end 13b of the coupling fiber 13 through the lens 23, generates a photocurrent depending on intensity of the light provided therefrom. The PD 21 is mounted on the sub-mount 25, which is made of insulating material. That is, the PD 21 of the present embodiment is mounted on the stem 24 through the pre-amplifier 26 and the insulating sub-mount 25. The pre-amplifier 26 may converts the photocurrent provided from the PD 21 into a voltage signal and externally outputs the converted voltage signal through the lead terminals 27.

Figure 2:
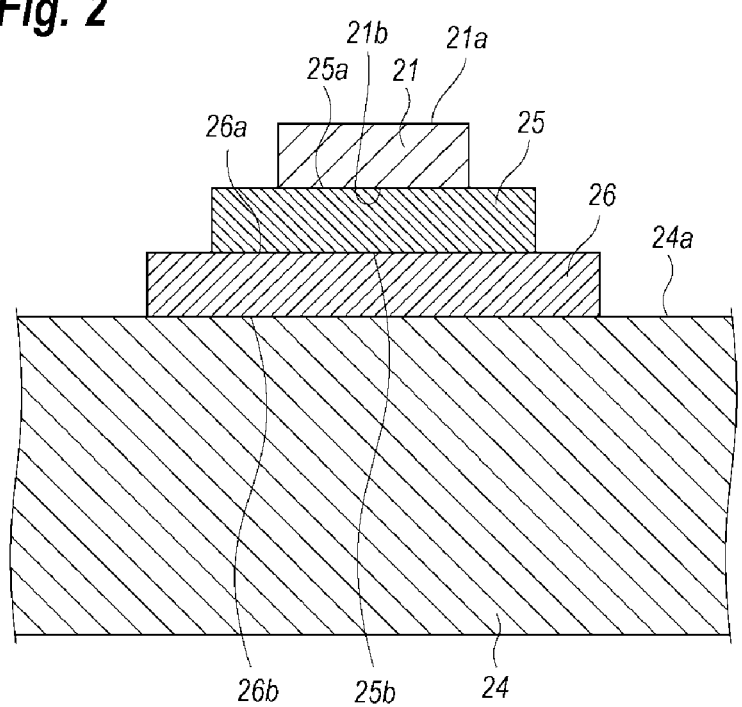
FIG. 2 is a cross sectional view magnifying an assembly of the photodiode, the sub-mount, and the pre-amplifier on the stem.

FIG. 2 is a cross sectional view magnifying an assembly of the PD 21, the sub-mount 25, and the pre-amplifier 26 on the stem 24. As shown in FIG. 2, the pre-amplifier 26 provides a top surface 26a and a rear surface 26b that faces and is in contact to the primary surface 24a of the stem 24. The sub-mount 25 also provides a top surface 25a and a rear surface 25b that faces and is in contact to the top surface 26a of the pre-amplifier 26. The PD 21 provides a top surface 21a and a rear surface 21b, where the top surface 21a faces the lens 23 and receives the light while the rear surface 21b faces and is in contact to the top surface 25a of the sub-mount 25.

Figure 3:
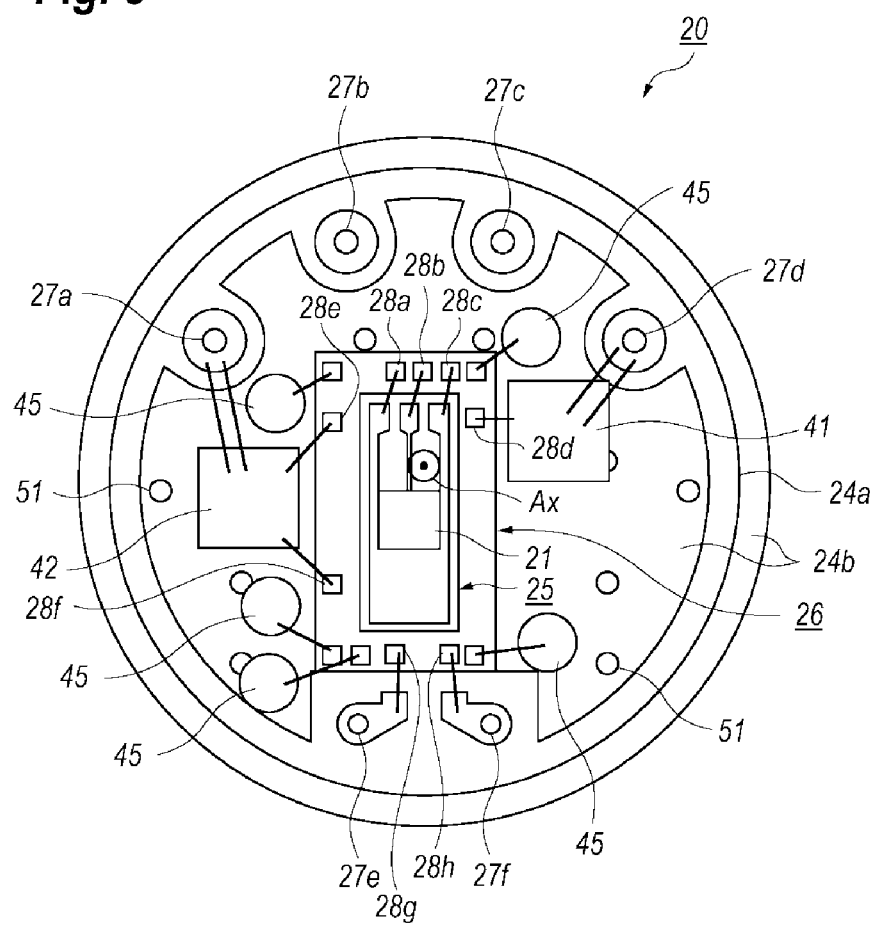
FIG. 3 is a plan view of the primary surface of the optical device, where FIG. 3 removes the cap in order to show the primary surface thereof.
Figure 4:
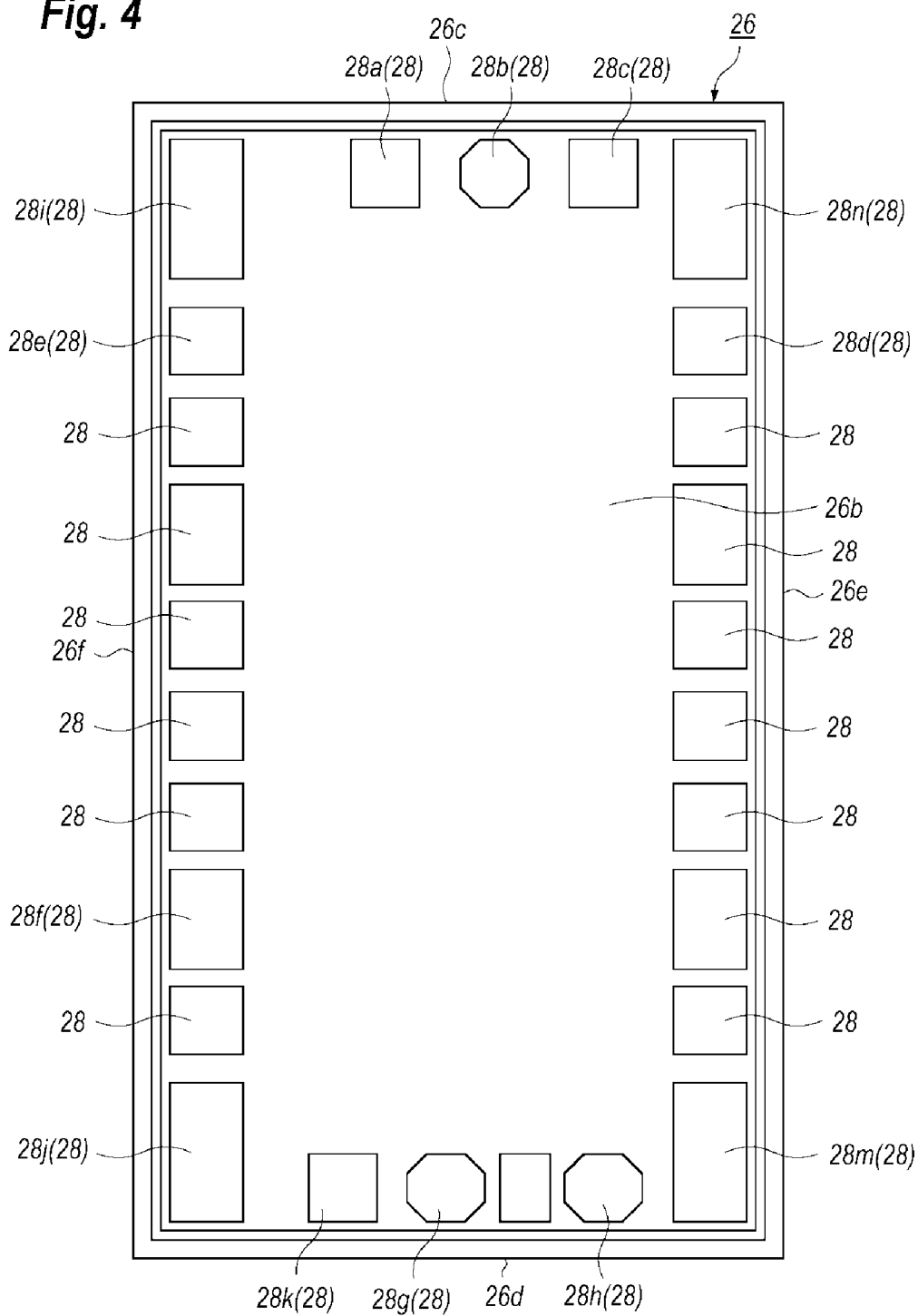
FIG. 4 is a plan view of the top surface of the pre-amplifier.
Figure 5:
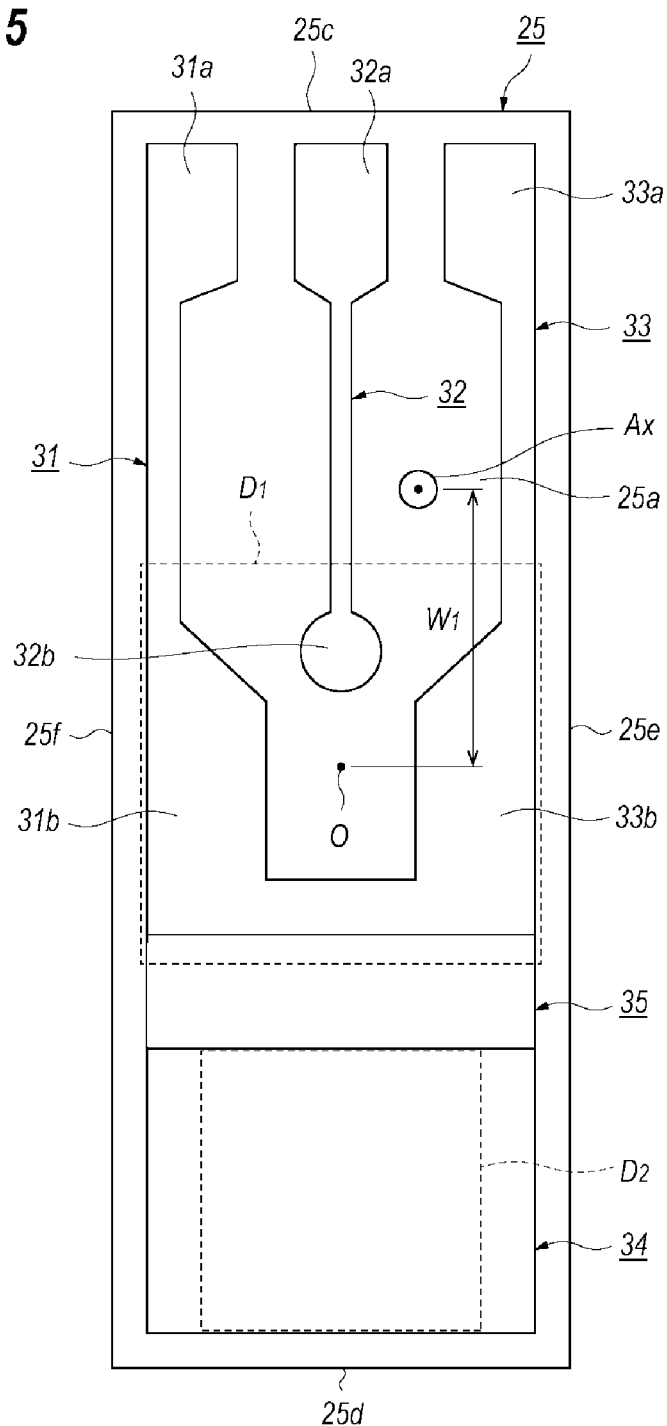
FIG. 5 is a plan view of the top surface of the sub-mount.

FIG. 3 to FIG. 5 are a plan views of the primary surface 24a of the optical device 20; the top surface 26a of the pre-amplifier 26; and the top surface 25a of the sub-mount 25, respectively, where FIG. 3 removes the cap 22 to show the primary surface 24a of the stem 24. The primary surface 24a of the stem 24 provides a ground pattern 24b that is electrically connected to ground lines provided in a rear surface of the stem 24 through vias, where the ground lines are connected to one or more lead terminals providing the ground. The stem 24 also provides the lead terminals, 27a to 27f, in a periphery of the primary surface 24a.

As shown in FIG. 4, the pre-amplifier 26, which has a rectangular plane shape demarcated by lateral sides, 26c and 26d, and longitudinal sides, 26e and 26f, provides pads 28 in the top surface 26a thereof. Three of the pads, 28a to 28c, disposed along one of the lateral side 26c are electrically connected with the PD 21, specifically, two pads, 28a and 28c, are connected with a cathode of the PD 21, while, the pad 28b is connected with an anode of the PD 21 to receive the photocurrent therefrom. Accordingly, those pads, 28a to 28c, connected with the PD 21 may be called as signals pads.

The pad 28d disposed at the longitudinal side 26e receives the bias to be provided to the PD 21 from the output of the receiver optical module 1A through a lead terminal 27d. Specifically, referring to FIG. 3, the pad 28d is wire-bonded with a capacitor 41 mounted on the ground pattern 24b, and the capacitor 41 is wire-bonded with the lead terminal 27d. The capacitor 41, which may be a type of die-capacitor with a top surface and a rear surface, is mounted on the ground pattern 24b via conductive adhesive which is typically conductive resin. The pads, 28e and 28f, that are disposed in the longitudinal side 26f supply power to the pre-amplifier 26. Those pads, 28e and 28f, are wire-bonded with a capacitor 42 type of also die-capacitor; and the capacitor 42 is wire-bonded with the lead terminal 27a. The capacitor 42 is also mounted on the ground pattern 24b via conductive resin. The pads 28g and 28h, arranged in the lateral side 26d extract the voltage signals converted from the photocurrent generated by the PD 21 to an outside of the receiver optical module 1A. As shown in FIG. 3, the pad 28g is wire-bonded with the lead terminal 27e, and the other pad 28h is wire-bonded to the lead terminal 27f.

The pads, 28i to 28n, which define the ground, are grounded to the ground pattern 24b though respective ground posts 45. Also, the pre-amplifier 26 provides some of pads 28 including that for monitoring the photocurrent, and that adjusting a gain of the pre-amplifier 26.

The sub-mount 25, which has also a rectangular plane shape demarcated by lateral sides, 25c and 25d, and longitudinal sides, 25e and 25f, where the longitudinal sides, 25e and 25f, of the sub-mount 25 is aligned with and parallel to the longitudinal sides, 26e and 26f, of the pre-amplifier 26. The sub-mount 25 in an area thereof is greater than a half of an area of the pre-amplifier 26. Square frame $D_1$ defined by a broken line shown in FIG. 5 indicates an area where the PD 21 is to be mounted thereon.

The sub-mount 25 provides, in the top surface 25a thereof, first to third interconnections, 31 to 33, connected with the PD 21, where the first to third interconnections, 31 to 33, longitudinally extend and disposed along the lateral direction in this order; that is, the second interconnection 32 is put between the first and third interconnections, 31 and 33. The first to third interconnections, 31 to 33, in respective one ends thereof are overlapped with the area for mounting the PD 21. Specifically, the interconnection 32 in an end pad 32b thereof and the other two interconnections, 31 and 33, in respective end pads, 31b and 33b, thereof are connected with pads provided in the rear surface 21b of the PD 21, respectively, via conductive resin. The interconnections, 31 to 33, also provide respective other end pads, 31a to 33a, arranged in the lateral side 25c of the sub-mount 25 with a gap therebetween of, for instance, 50 µm. As shown in FIG. 3, the pads, 31a to 33a, are wire-bonded with the signal pads, 28a to 28c, of the pre-amplifier 26 by respective bonding wires. Thus, the interconnections, 31 to 33, connect the pad 28b with one of the electrodes of the PD 21 and the pads, 28a and 28c, with the other of the electrodes of the PD 21.

The sub-mount 25 further provides another interconnection 34 on the top surface 25a thereof between the interconnections, 31 to 33, and the lateral side 25d putting an area 35 to prevent the conductive resign from spreading out. The area 35 partially overlaps with the area for mounding the PD 21. The interconnection 34 mounts a capacitor where a square frame $D_2$ shown in FIG. 5 indicates the area where the die-capacitor is to be mounted thereon. Accordingly, the back electrode of this capacitor is directly connected with the interconnection 34, while, the top electrode thereof is connected with the one of signal pads, 28k to 28o, of the pre-amplifier 26.

FIG. 3 and FIG. 5 indicate the axis Ax of the receptacle 10, which is slightly offset from a center of the stem 24, or that of the cap 22. The present embodiment disposes the signal pads, 28a to 28c, of the pre-amplifier 26 and the pads, 31a to 33a, in the sub-mount 25 in a side opposite to the axis Ax with respect to the center O of the PD 21. That is, the axis Ax of the receptacle 10 is disposed between the signal pads, 28a to 28c, and the pads, 31a to 33a, and between the pads, 31a to 33a, and the center O of the PD 21. The axis Ax forms a distance against the center O of the PD 21 along the longitudinal direction of the sub-mount 25 to be around 200 µm. The interconnections, 31 and 33, have a length along the longitudinal direction of the sub-mount 25 that is longer than a quarter of a longitudinal length of the sub-mount 25, preferably, longer than a half of the longitudinal length of the sub-mount 25.

Figure 20:
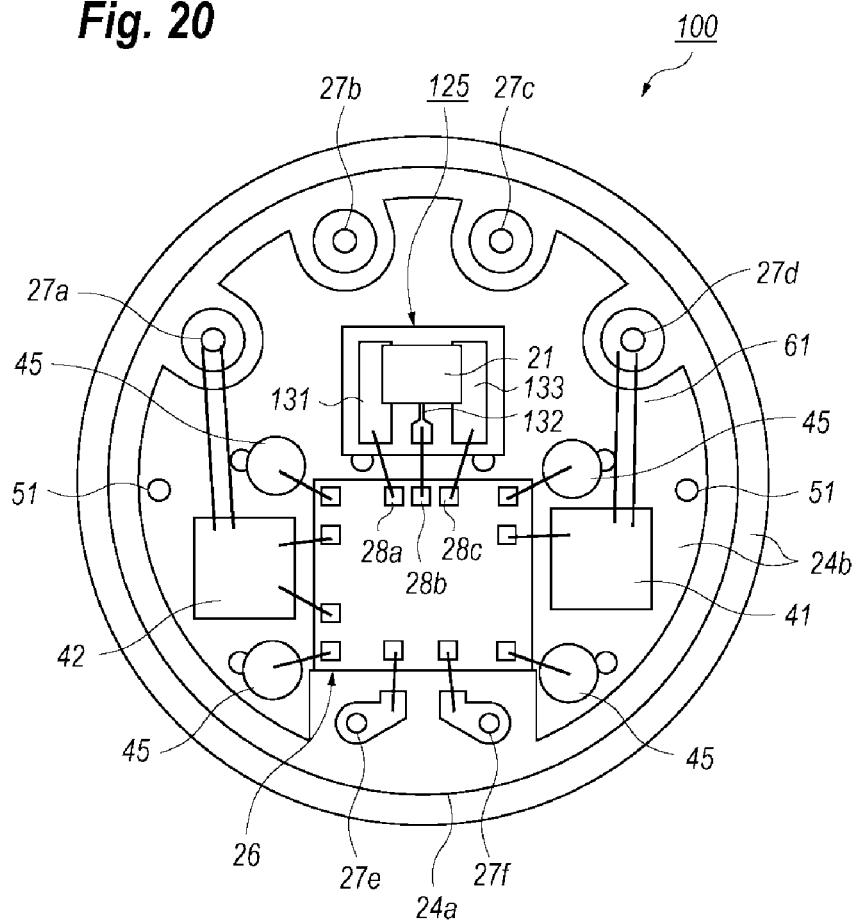
FIG. 20 is a plan view of the primary surface of the stem according to a conventional receiver optical module.
Figure 21:
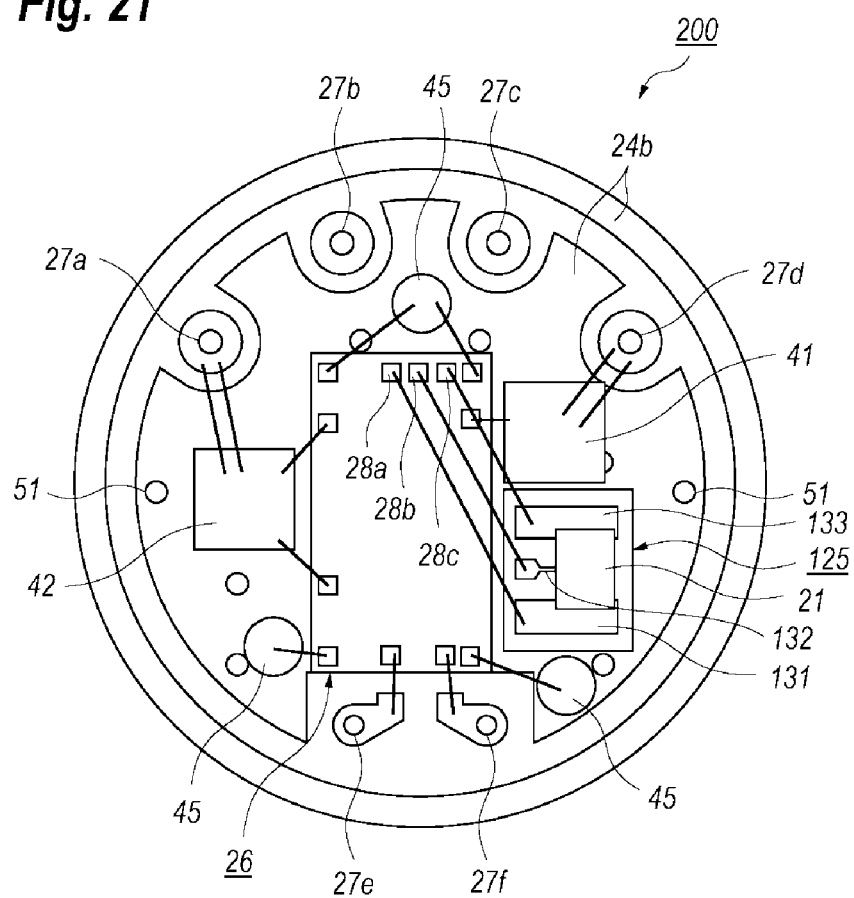
FIG. 21 is a plan view of the primary surface of the stem according to still another conventional receiver optical module.

Advantages of the receiver optical module 1A according to the embodiment of the present invention will be explained. FIG. 20 and FIG. 21 are plan views of stems 24 in conventional receiver optical modules, 100 and 200. In those receiver optical modules, 100 and 200, the sub-mount 125 is disposed side by side of the pre-amplifier 26, that is the PD 21 mounted on the sub-mount 125 but the sub-mount 125 is mounted directly on the ground pattern 24b of the stem 24 not the pre-amplifier 26. The sub-mount 125 also provides the interconnections, 131 to 133, electrically connected with the PD 21 on the top surface thereof but those interconnections, 131 to 133, have lengths shorter than those of the interconnections, 31 to 33, of the present embodiment.

When the pre-amplifier 26 has an area enough smaller than an area of the primary surface 24a of the stem 24 like the conventional receiver optical module 100 shown in FIG. 20, the PD 21 may be disposed closer to the axis Ax of the receptacle 10 and the pre-amplifier 26 may be disposed closer to the PD 21, namely, closer to the sub-mount 125 to shorten lengths of the bonding wires connecting the sub-mount 125 with the pre-amplifier 26. However, in an arrangement on the stem 24 for another receiver optical module 200 shown in FIG. 21, when the pre-amplifier 26 enlarges the planar size thereof, the sub-mount 125 becomes hard or substantially impossible to be mounted enough closer to the signal pads, 28a to 28c, of the pre-amplifier 26, which inevitably elongates bonding wires connecting the sub-mount 125 with the pre-amplifier 26. Moreover, the PD 21 or the sub-mount 125 becomes also impossible to be disposed closer to the axis Ax of the receptacle 10.

The receiver optical module 1A of the embodiment, the sub-mount 25 that mounts the PD 21 thereon is mounted on the pre-amplifier 26, which enhances freedom of the disposition of the PD 21 through the sub-mount 25 and enables the PD 21 to be disposed closer to the axis Ax.

However, when the sub-mount 125 shown in FIG. 20 and FIG. 21 is to be mounted on the pre-amplifier 26, the bonding wires connecting the sub-mount 125 with the signal pads, 28a to 28c, of the pre-amplifier 26 are not always shortened. When the sub-mount 125 in the pads to be connected with the pre-amplifier 26 is disposed on the pre-amplifier 26 so as to shorten the bonding wires connecting therebetween; the sub-mount 125 in the position thereof on the pre-amplifier 26 is restricted against the positions of the signal pads, 28a to 28c, of the pre-amplifier 26. Accordingly, the sub-mount 25 of the present embodiment provides the interconnections, 31 to 33, thereon, which may increase a distance between the signal pads, 28a to 28c, of the pre-amplifier 26 and the PD 21, and the sub-mount 25 may be optionally disposed on the pre-amplifier 26. Moreover, the receiver optical module 1A of the embodiment disposes the signal pads, 28a to 28c, of the pre-amplifier 26 and the pads, 31a to 33c, on the sub-mount 25 in the side opposite to the center O of the PD 21 with respect to the axis Ax of the receptacle 10. This arrangement enables the PD 21 to dispose in a position offset from the axis Ax even when the pre-amplifier 26 in the dimensions thereof is wide enough compared with the area of the primary surface 24a of the stem 24.

The sub-mount 25 may have an area greater than a half of the area of the pre-amplifier 26, which may also enable the PD 21 to be optionally mounted on the pre-amplifier 26 in a position slightly offset from the axis Ax of the receptacle 10.

Also, the interconnections, 31 to 33, provided on the top surface 25a of the sub-mount 25 preferably have lengths longer than a quarter of the longitudinal side of the sub-mount 25, which enables the PD 21 to be optionally mounted on the pre-amplifier 26 to be slightly offset from the axis Ax of the receptacle 10.

First Modification

Figure 6:
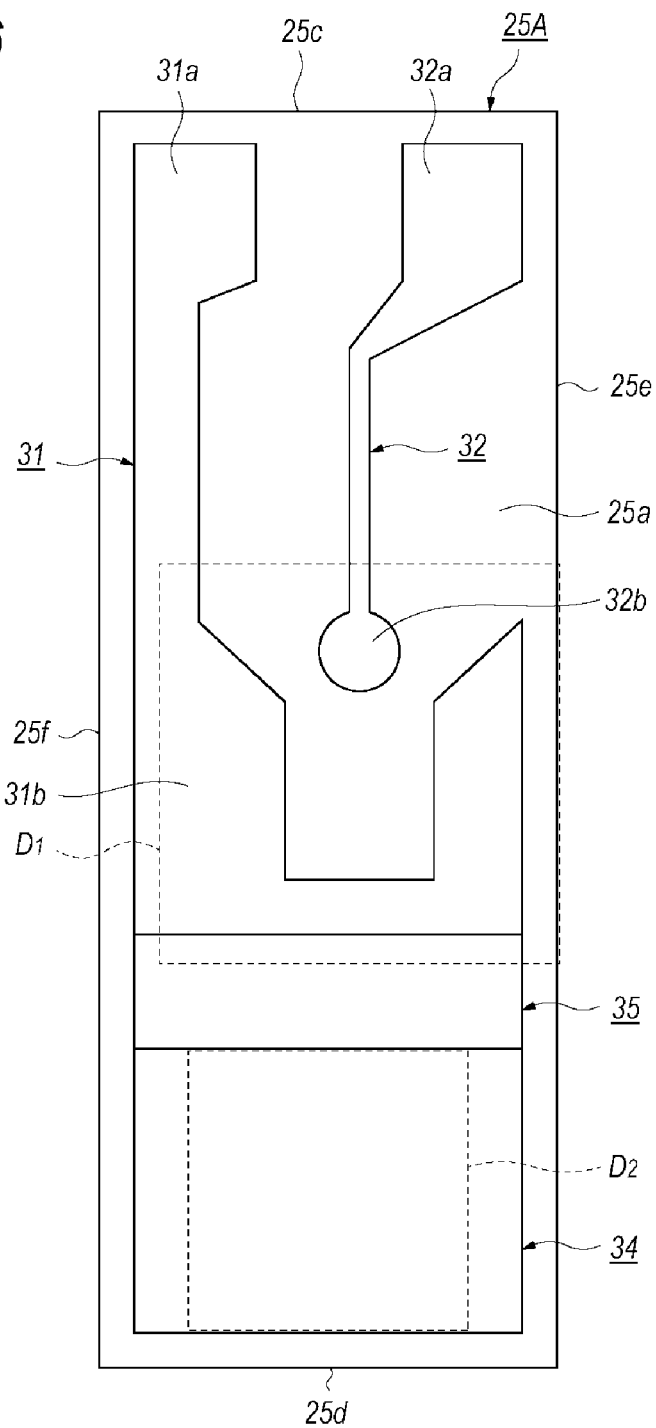
FIG. 6 is a plan view showing a top surface of another sub-mount modified from the aforementioned sub-mount.

FIG. 6 is a plan view showing a top surface 25a of another sub-mount 25A that is modified from the aforementioned sub-mount 25. The modified sub-mount 25A has a feature distinguishable from the aforementioned sub-mount 25 is that the modified sub-mount 25A removes the third interconnection 33 among the interconnections, 31 to 34, in the aforementioned sub-mount 25. Accordingly, the PD 21 is connected with the pre-amplifier 26 only through two interconnections, 31 and 32, and the bonding wires coupled thereto. In the arrangement shown in FIG. 6, the pads, 31a and 32a, may widen the gap therebetween compared with the aforementioned arrangement shown in FIG. 5.

Second Modification

Figure 7:
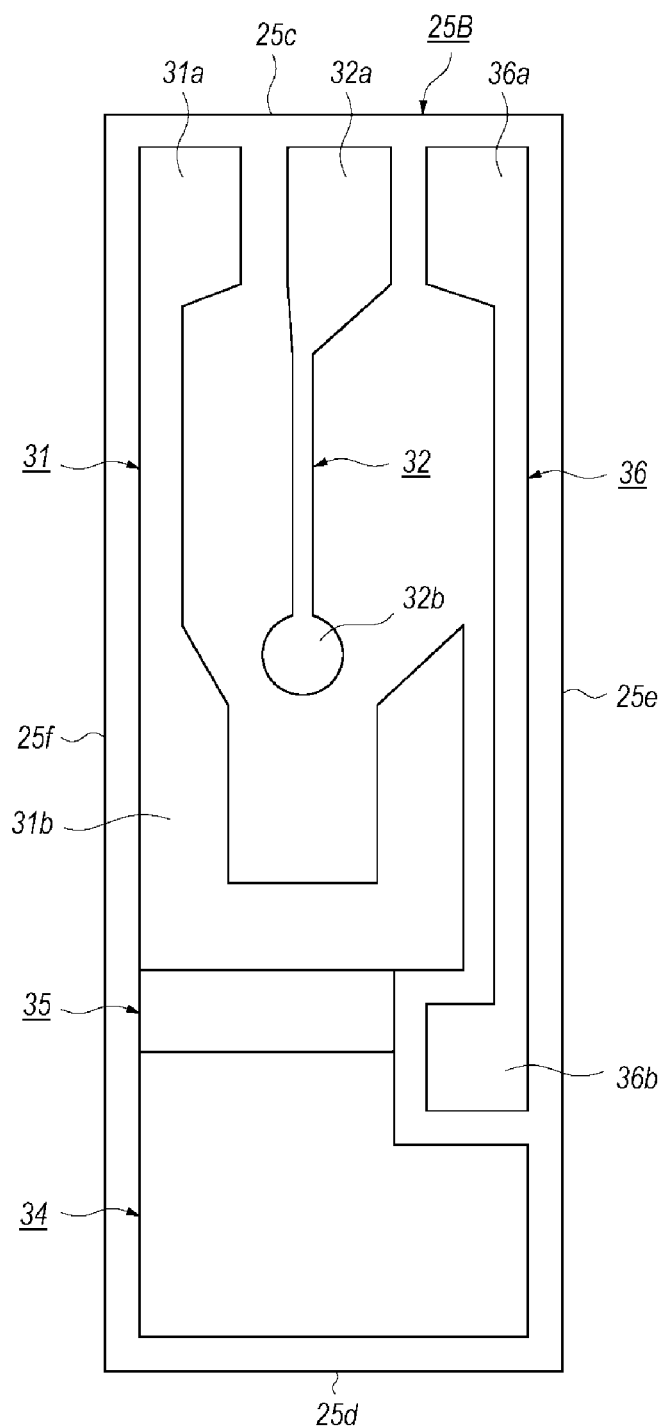
FIG. 7 is a plan view showing the top surface of sub-mount according to still another modification.
Figure 8:
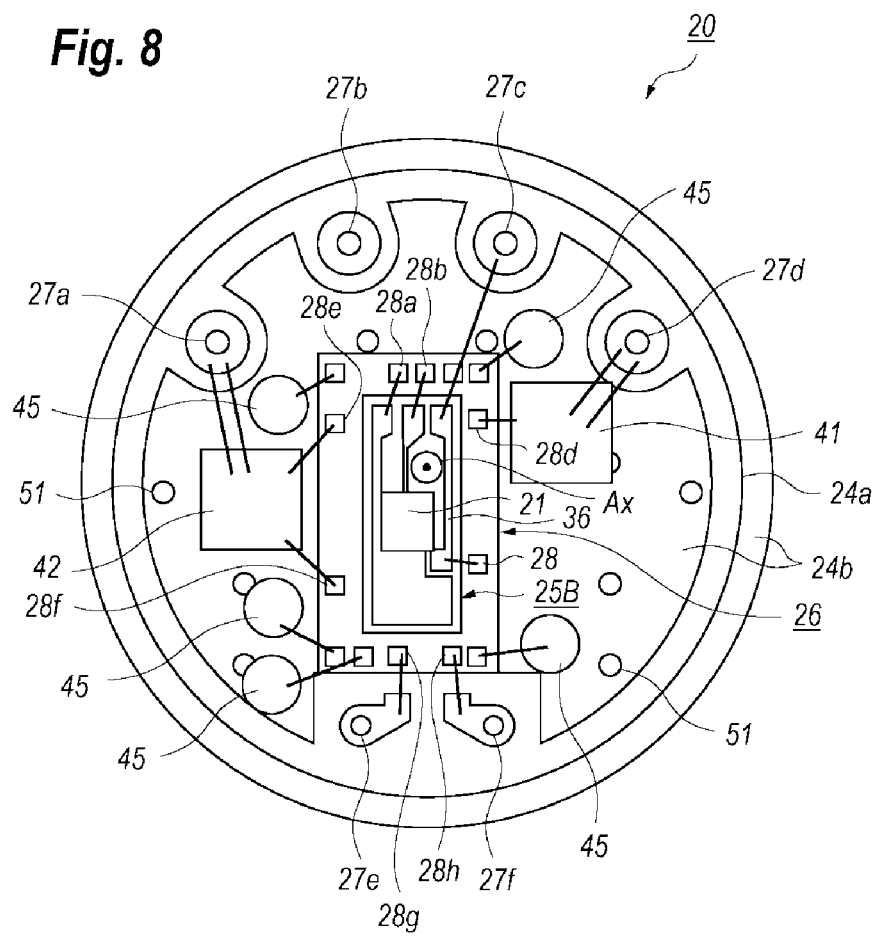
FIG. 8 is a plan view showing the primary surface of the stem according to the second modification.

FIG. 7 is a plan view showing the top surface 25a of still another sub-mount 25B, and FIG. 8 is a plan view showing the primary surface 24a of the stem 24. The modified sub-mount 25B has a feature distinguishable from those of the aforementioned sub-mounts, 25 and 25A, that the sub-mount 25B provides another interconnection 36 instead of the one of the interconnections 31 extending along the longitudinal side 25e; that is, the interconnections, 31, 32 and 36, are arranged side by side along the lateral side 25c, and the interconnection 36 extends along the longitudinal side 25e.

The interconnection 36 includes a pad 36b in one end thereof neighbor to the interconnection 34 in addition to another pad 36a disposed in the lateral side 25c of the sub-mount 25B. As shown in FIG. 8, the pad 36b is wire-bonded to one of the pads 28 of the pre-amplifier 26 except for the pads, 28a to 28k, described above. The pad 28 wire-bonded with the pad 36b is one of the bias pads of the pre-amplifier 26.

Figure 19:
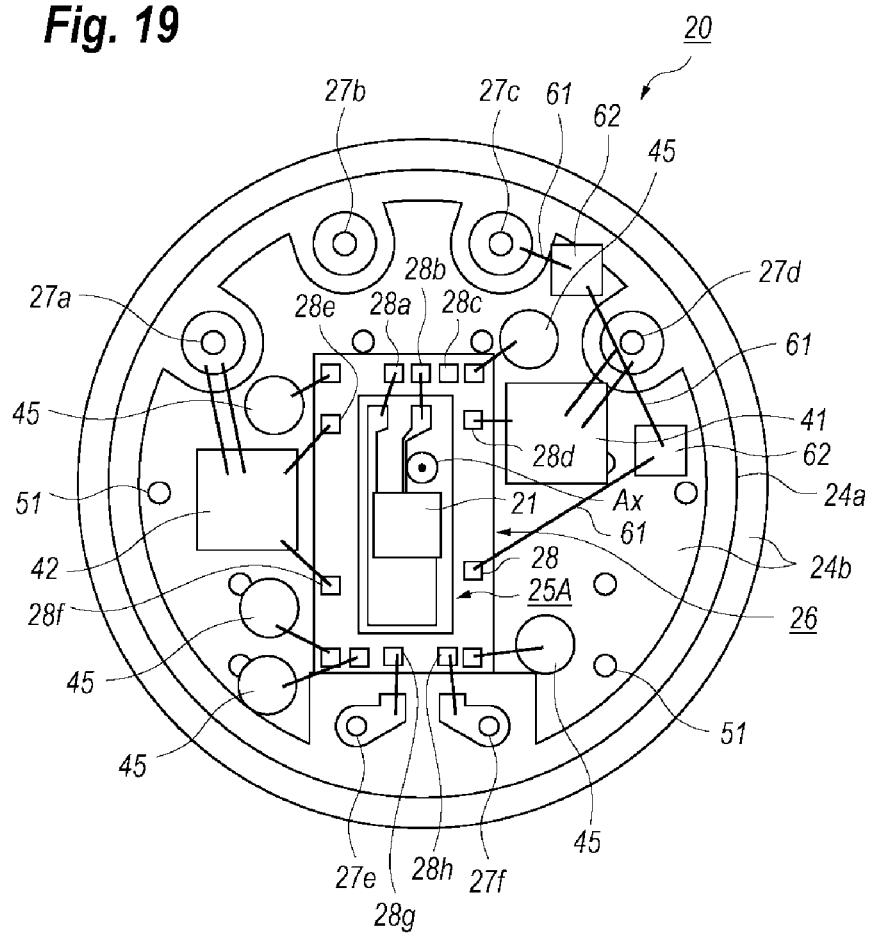
FIG. 19 is a plan view of the primary surface of the stem that mounts the PD on the pre-amplifier via the sub-mount but the pre-amplifier in the bias pads thereof is connected with the lead terminal through two capacitors.

The pad 36a of the interconnection 36 is wire-bonded directly with the lead terminal 27c. Thus, the lead terminal 27 may be electrically connected with the PD 21 and the bias pad 28 of the pre-amplifier 26. When the receiver optical module 1A implements the modified sub-mount 25B substituted from the sub-mount 25 shown in FIG. 5, the PD 21 may be optionally disposed in a position on the pre-amplifier 26 offset from the axis Ax of the receptacle 10. Also, the bonding wire connecting the bias pad 36b of the sub-mount 25B with the bias pad 28 of the pre-amplifier 26 may be shortened. FIG. 19 is a plan view showing the primary surface 24a of the stem 24 when the PD 21 is mounted on the pre-amplifier 26 through the sub-mount 25A of the first modification but the bias pad 28 of the pre-amplifier 26 is connected with the lead terminal 27c through two capacitors, 61 and 62. Thus, the arrangement of the interconnection 36 on the sub-mount 25B of the present modification makes the disposition of the bonding wires considerably simple.

Second Embodiment

Figure 9:
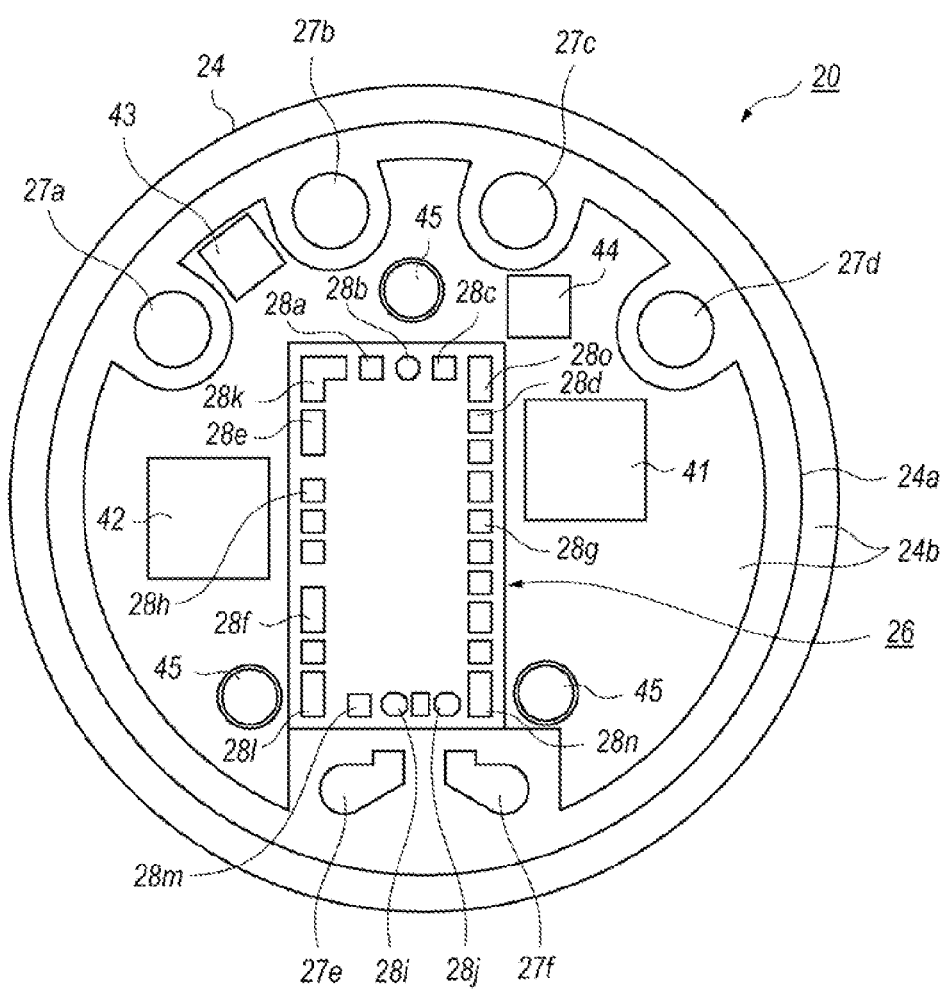
FIG. 9 is a plan view of the receiver optical module at a step of assembling the same according to the second embodiment of the present invention.
Figure 10:
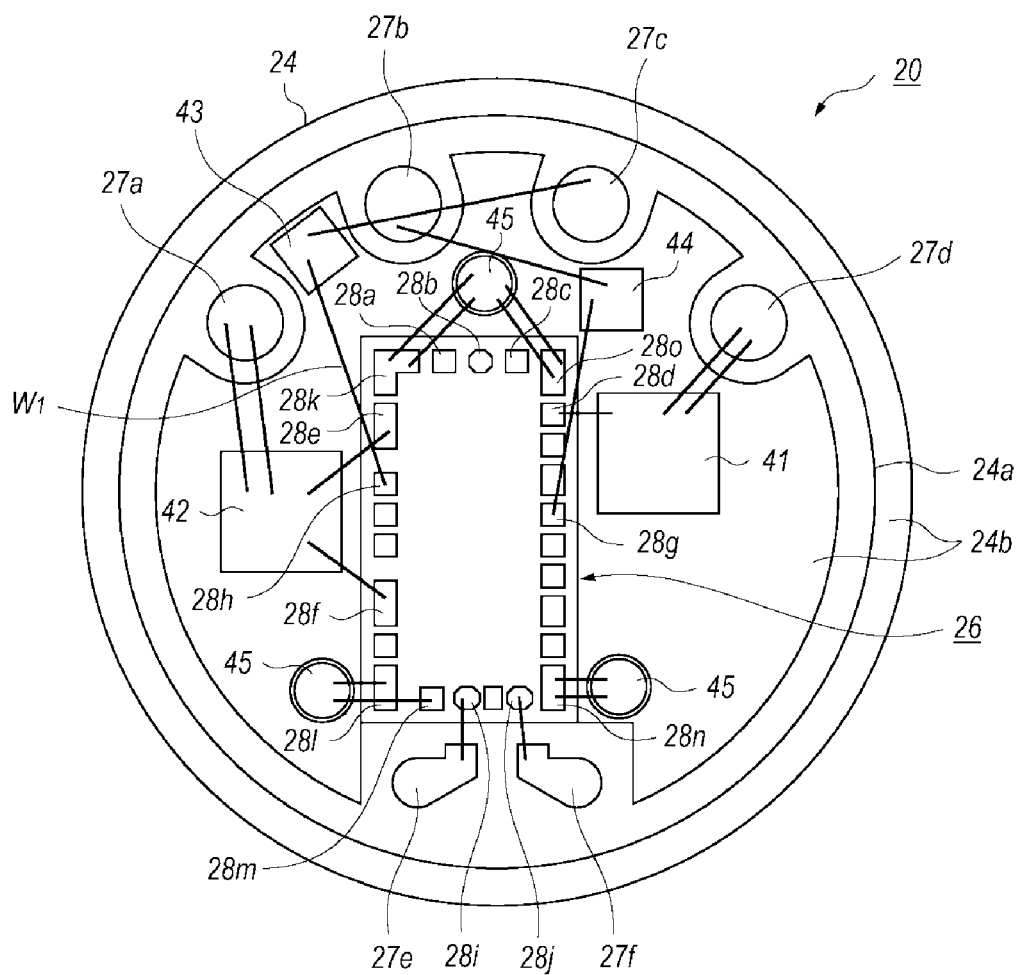
FIG. 10 is a plan view of the receiver optical module at a step subsequent to that shown in FIG. 9.
Figure 11:
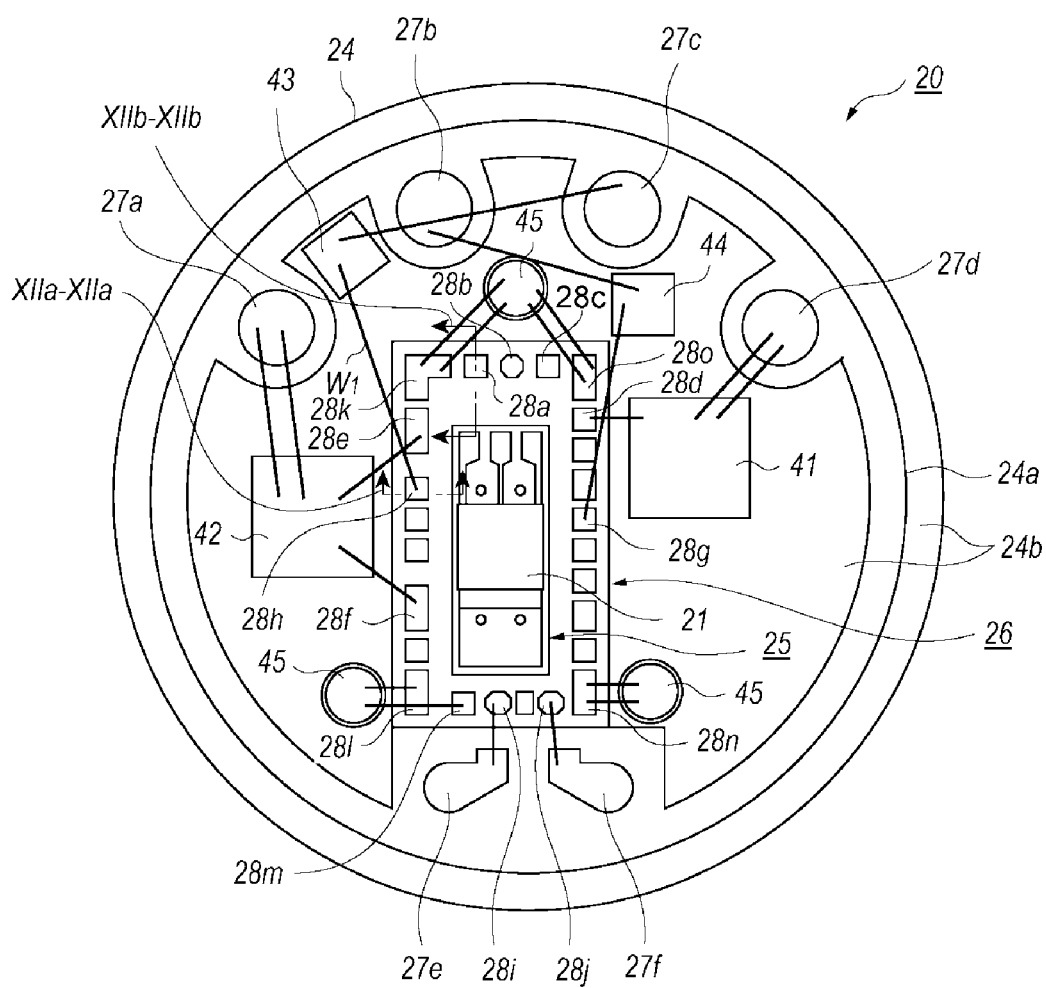
FIG. 11 is a plan view of the receiver optical module at a step subsequent to that shown in FIG. 10.
Figure 12A:
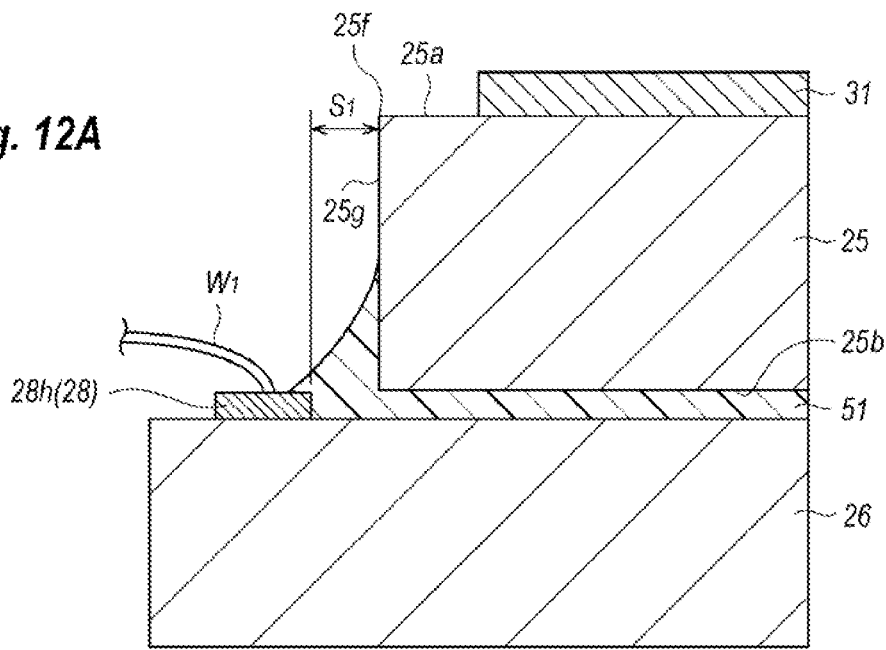
FIG. 12A and FIG. 12B are cross sectional views of the receiver optical module taken along the lines, XIIa-XIIa and XIIb-XIIb, each indicated in FIG. 11.
Figure 12B:
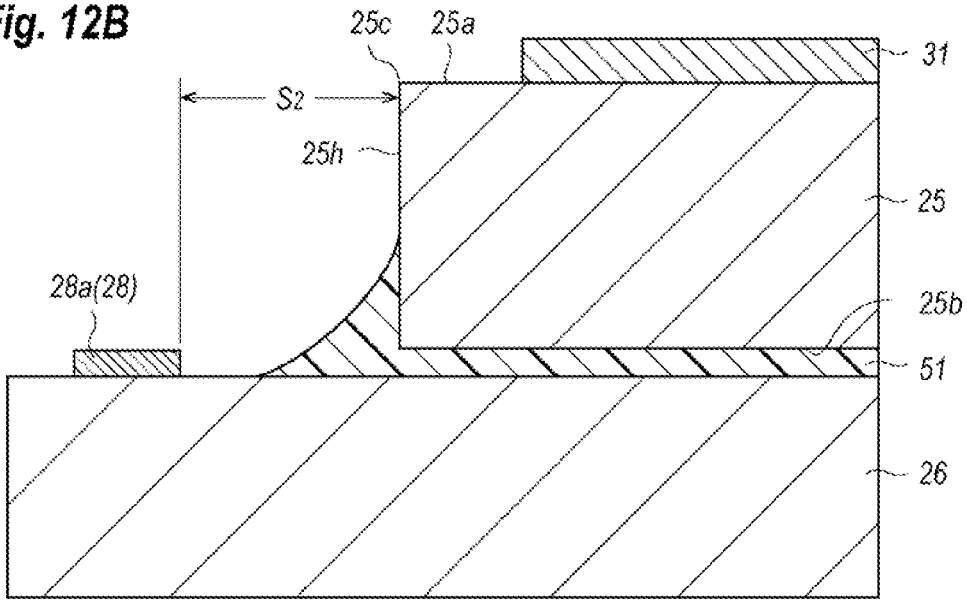
Figure 13:
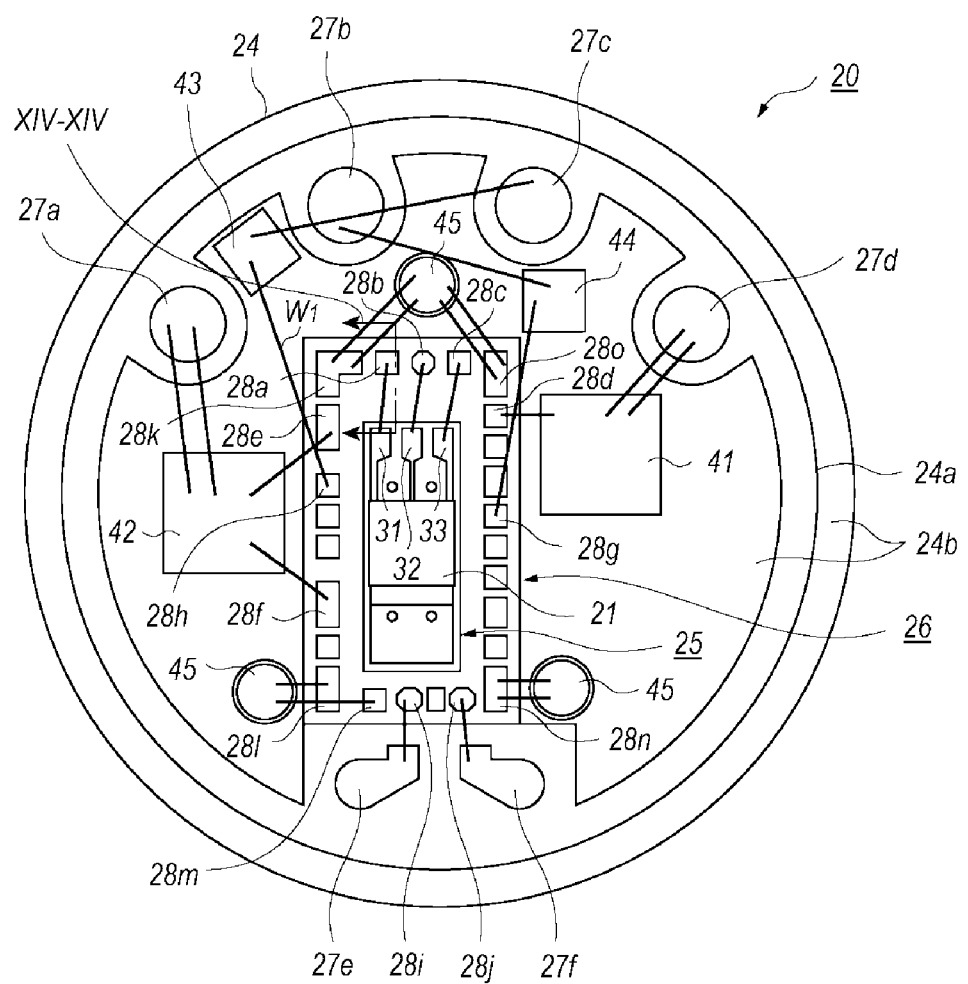
FIG. 13 is a plan view of the receiver optical module at a step subsequent to that shown in FIG. 11.
Figure 14:
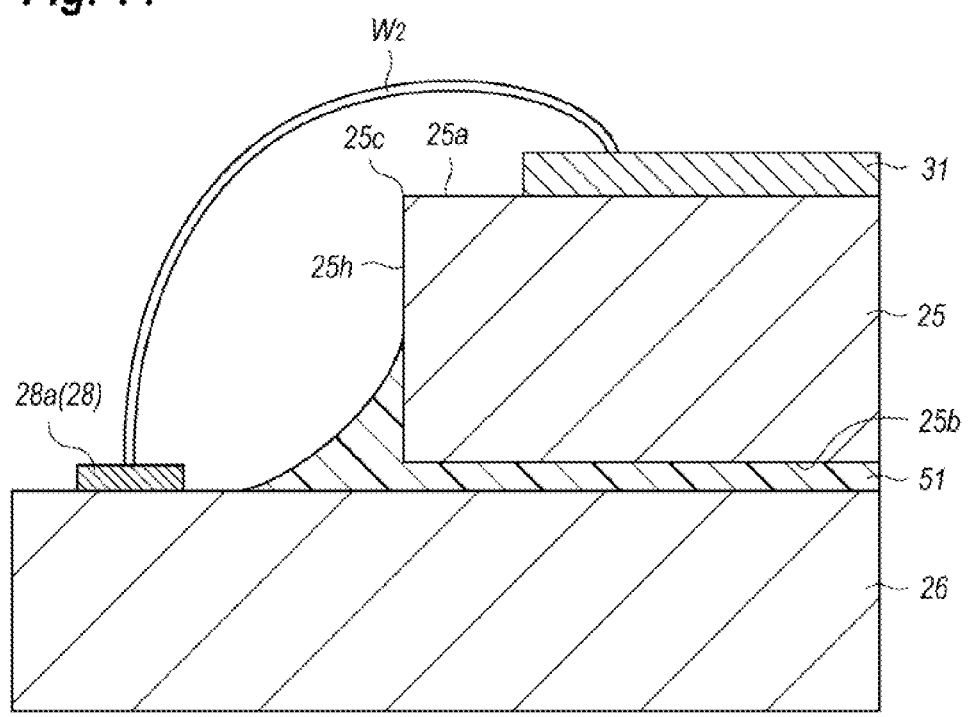
FIG. 14 is a cross sectional view of the receiver optical module taken along the line XIV-XIV indicated in FIG. 13.

Next, a process of assembling the receiver optical module 1A will by described referring to FIG. 9 to FIG. 14, where FIG. 9 to FIG. 11 and FIG. 13 show steps of the process by respective plan views of the primary surface 24a of the stem 24, FIG. 12A and FIG. 12B are cross sectional views of the assembly of the stem 24, the pre-amplifier 26, the sub-mount 25, and the PD 21, taken along the line XIIa-XIIa and XIIb-XIIb, respectively, each indicated in FIG. 11; and FIG. 14 is a cross sectional view of the assembly taken along the line XIV-XIV indicated in FIG. 13.

Referring to FIG. 9, the process first mounts the pre-amplifier 26, and some passive components including the capacitors, 41 to 44, on the primary surface 24a of the stem 24. The pre-amplifier 26 in the rear surface 26b thereof faces and is in contact with the primary surface 24a of the stem 24. The top surface 26a and the pads 28 on the top surface 26a are exposed. The passive components including the capacitors, 41 to 44, are preferably mounted on the primary surface 24a of the stem 24 after the mount of the pre-amplifier 26 but the order of the mount is optional.

Thereafter, as shown in FIG. 10, some pads 28 are wire-bonded with the passive components on the stem 24. Specifically, the pads 28 disposed along the longitudinal sides, 26e and 26f, of the pre-amplifier 26 are wire-bonded with the passive components; that is, the pad 28d is wire-bonded with the capacitor 41, the pads, 28e and 28f, are wire-bonded with the capacitor 42, the pad 28g is wire-bonded with the capacitor 44, and the pad 28h is wire bonded with the capacitor 43. Also, the pads, 28i and 28j are wire-bonded with the lead terminals, 27e and 27f, respectively. The pads, 28k to 28o, are connected with respective ground posts 45 that are metal columns directly mounted on the ground pattern 24b. In addition, the capacitors, 41 to 44, are wire-bonded with the lead terminals, 27d, 27a, 27c, and 27b, respectively.

Thereafter, as shown in FIG. 11, the process mounts the sub-mount 25, on which the PD 21 is mounted, on the pre-amplifier 26. The rear surface 25b of the sub-mount 25 faces and is in contact with the top surface 26a of the pre-amplifier 26. As described above, the pads 28 of the pre-amplifier 26 are exposed on the top surface 26a thereof, but have respective distances against the sides, 25c to 25f, of the sub-mount 25. For instance, the signal pads, 28a to 28c, disposed along the lateral side 25c of the sub-mount 25, which are wire-bonded with the pads, 31a to 33a, of the sub-mount 25 have a distance against the lateral side 25c of the sub-mount 25 that is greater than distances between the pads, 28d to 28h, that are wire-bonded with the passive components mounted on the primary surface 24a of the stem 24 and the longitudinal sides, 25e and 25f, of the sub-mount 25. Specifically, referring to FIG. 12A and FIG. 12B, where FIG. 12A shows an arrangement along a side 25g including the longitudinal side 25f, while, FIG. 12B shows an arrangement along a side 25h including the lateral side 25c of the sub-mount 25, the former distance $S_1$ from that pad 28h to the side 25g is narrower than the latter distance $S_2$ from the pad 28a to the side 25h. The distance $S_2$ is preferably at least twice of the distance $S_1$. The present embodiment sets the latter distance $S_2$ between the signal pads, 28a to 28c, and the lateral side, 25c or 25h, to be 200 to 240 μm.

As shown in FIG. 12A and FIG. 12B, the process mounts the sub-mount 25 onto the pre-amplifier 26 with adhesive 51 type of ultraviolet curable resin. Such an adhesive is a fluid material before irradiation of ultraviolet rays. Accordingly, when the sub-mount 25 is placed onto the pre-amplifier 26 with the adhesive, an excess adhesive possibly spreads onto the top surface 26a of the pre-amplifier 26. Because the latter distance $S_2$ between the signal pads, 28a to 28c, and the side 25h is greater than the former distance $S_1$ between the pads 28 arranged along the longitudinal sides, 26e and 26f, of the pre-amplifier 26 and the side 25g of the sub-mount 25, the signal pads, 28a to 28c, becomes free from the adhesive 51.

Thereafter, as shown in FIG. 13, the process carries out the wire-bonding between the signal pads, 28a to 28c, with the pads, 31a to 33a, on the sub-mount 25, whose cross sectional view is shown in FIG. 14. Thus, the PD 21 may be mounted on the stem 24 through the pre-amplifier 26 and the sub-mount 25 and wire-bonded with the pre-amplifier 26. Thereafter, assembling the cap 22 that fixes the lens 23 thereto with the stem 24, the process of forming the optical device 20 is completed. Assembling the optical device 20 with the receptacle 10 after optically aligning the receptacle 10 with the PD 21 through the joint sleeve 19, the receiver optical module 1A is completed.

The receiver optical module 1A thus described mounts the PD 21 on the pre-amplifier 26 interposing the sub-mount 25 therebetween. This arrangement of the PD 21 and the pre-amplifier 26 enhances the flexibility for mounting the PD 21 on the stem 24 even when the receiver optical module 1A is necessary to implement a pre-amplifier 26 with large dimensions. Accordingly, the PD 21 may be placed closer to the axis Ax of the receptacle 10 but slightly offset therefrom. Also, the process of assembling the receiver optical module 1A first carries out the wire-bonding between the pads except for the signal pads, 28a to 28c, and the passive components mounted on the stem 24 in advance to mount the sub-mount 25 with the PD 21 on the pre-amplifier 26 interposing the adhesive therebetween. Even when an excess adhesive spreads onto the pads of the pre-amplifier 26 except for the signal pads, 28a to 28c, thereof, the wiring to those pads is already completed. Accordingly, the pads except for the signal pads, 28a to 28c, may be securely connected with the passive components on the stem 24.

In the present embodiment of the sub-mount 25 and the pre-amplifier 26, the signal pads, 28a to 28c, which are necessary to be wire-bonded after mounting the sub-mount 25 onto the pre-amplifier 26, has a larger distance against side 25h of the sub-mount 25. Accordingly, the signal pads, 28a to 28c, becomes substantially free from an excess adhesive spreading toward the signal pads, 28a to 28c, from a gap between the pre-amplifier 26 and the sub-mount 25.

Also, the sub-mount 25 of the present invention provides the interconnections, 31 to 33, on the top surface 25a thereof, where those interconnections, 31 to 33, have lengths longer than a quarter, or preferably a half of the longitudinal length of the sub-mount 25, which secures a distance between the signal pads, 28a to 28c, of the pre-amplifier 26 and the PD 21. Thus, the PD 21 may be optionally disposed on the pre-amplifier 26 independent of the positions of the signal pads, 28a to 28c. The signal pads, 28a to 28c, of the pre-amplifier 26 and the pads, 31a to 33a on the sub-mount 25 may be disposed opposite to the axis Ax of the receptacle 10 with respect to the center O of the PD 21, which enables the PD 21 to be disposed in a position offset from the axis Ax of the receptacle 10 even when the pre-amplifier 26 takes a greater part of the primary surface 24a of the stem 24.

Next, some modifications of the process of assembling the receiver optical module will be described.

Third Modification

Figure 15:
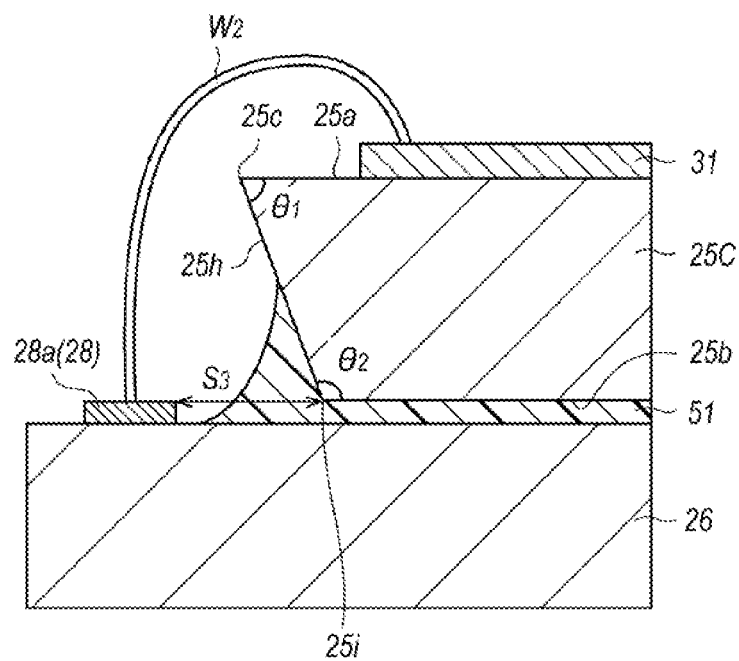
FIG. 15 is a cross sectional view of the signal pads and the sub-mount according to the third modification.

FIG. 15 is a cross sectional view of the signal pads, 28a to 28c, and the sub-mount 25C according to the third modification, which corresponds to that shown in FIG. 14. The sub-mount 25C of the present modification has a feature that at least the side 25h facing the signal pads, 28a to 28c, of the pre-amplifier 26 is inclined, or forms an overhang. Specifically, the sub-mount 25C forms an acute angle $\theta_1$ between the side 25h and the top surface 25a thereof, while an obtuse angle $\theta_2$ between the side 25h and the bottom surface 25b thereof. Accordingly, the edge 25i in the bottom surface 25b makes a distance $S_3$ from the signal pads, 28a to 28c, which is greatest in the side 25h. The side 25h with the negative slope may suppress the adhesive 51 from being detached thereof because of the surface tension of the adhesive 51. Accordingly, even when the distance $S_3$ above defined is shorter than the distance $S_1$ between the side 25g of the sub-mount 25 and the pads except for the signal pads, 28a to 28c, which is shown in FIG. 12A, the adhesive 51 is suppressed from spreading out toward the signal pads, 28a to 28c.

Fourth Modification

Figure 16:
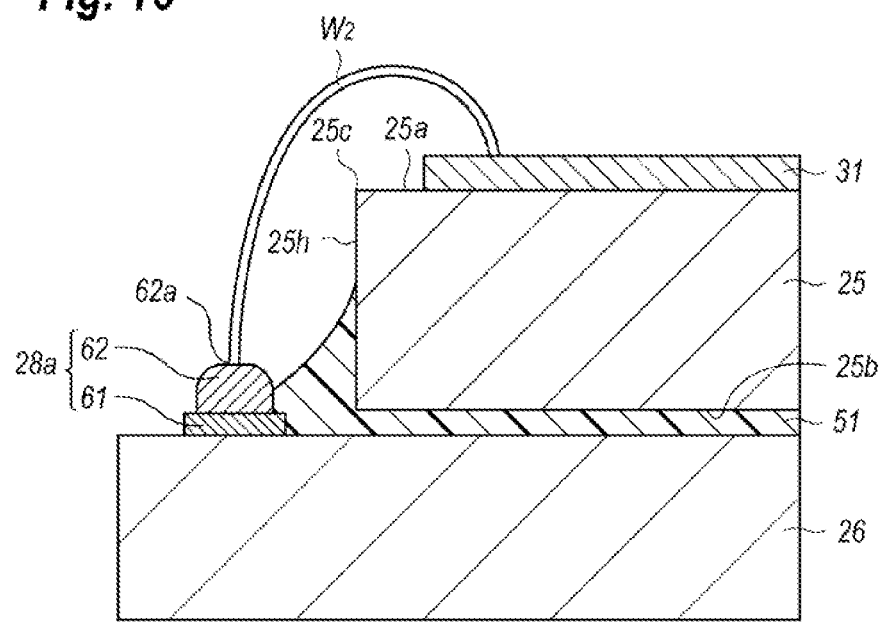
FIG. 16 is a cross sectional view of the sub-mount and the pre-amplifier around the signal pads thereof according to the fourth modification.

FIG. 16 is a cross sectional view of the sub-mount 25 and the pre-amplifier 26 around the signal pads, 28a to 28c, thereof. As shown in FIG. 16, the present modification provides the signal pad 28a including a metal pattern 61 formed on the top surface 26a of the pre-amplifier 26 and a conductive post 62 stacked on the metal pattern 61. The post 62 may be a gold bump formed using the ball bonder. The post 62 may be a solder bump. The signal pad 28a has a height preferably greater than 20 μm but lower than 50 μm, which is at least higher than a thickness of the adhesive 51, or the gap to be formed between the sub-mount 25 and the pre-amplifier 26. The post 62 may be formed during the process for forming the pre-amplifier 26. The other signal pads, 28b and 28c, may have the structure shown in FIG. 16. Because the signal pad 28a in a top of the post 62a exposes from the spreading adhesive 51, the wire-bonding thereto becomes possible even when the excessive adhesive 51 spreads from the gap between the sub-mount 25 and the pre-amplifier 26. Also, the signal pads, 28a to 28c, may take a distance against the side 25h of the sub-mount 25 that is greater than the distance $S_1$ between the pads except for the signal pads, 28a to 28c, and the longitudinal side, 25e or 25f, of the sub-mount 25.

Fifth Modification

Figure 17A:
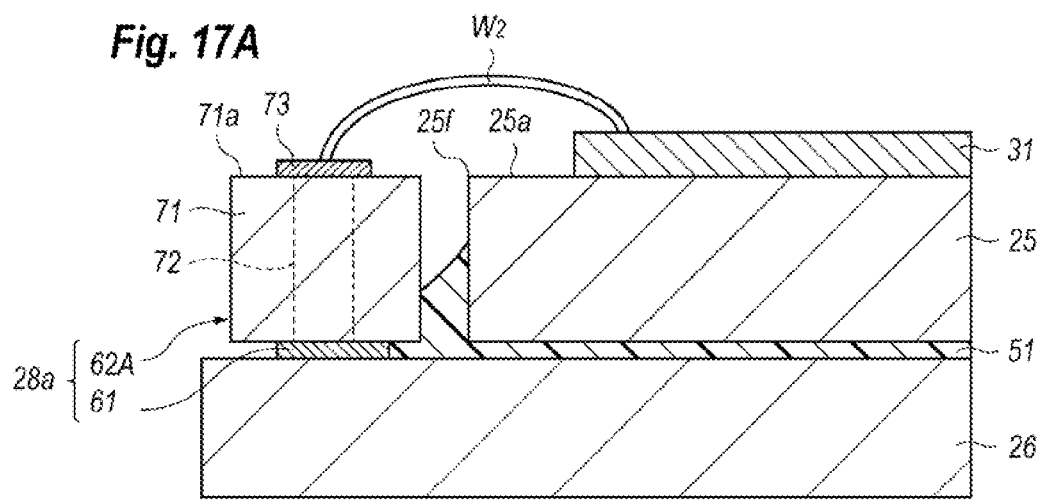
FIG. 17A is a cross sectional view around the signal pad and the sub-mount of the fifth modification thereof.

FIG. 17A is a cross sectional view around the signal pad 28a and the sub-mount 25 of the fifth modification. The arrangement shown in FIG. 17A has a feature that the signal pad 28a includes the metal pattern 61 on the primary surface 26a of the pre-amplifier 26 and an post 62A stacked on the metal pattern 61, where the post 62A, which has a function of a relay member, by for instance, a flip-chip bonding. The post 62A includes a base with a rectangular block 71, via metals 72 buried within the rectangular block 71, and pads 73 provided on a top surface 71a of the rectangular block 71 and electrically connected with the metal pattern 61 through the via metals 72. The via metals 72 in respective ends thereof expose from the rectangular block 71, one of which is in contact with the metal pattern 61, while the other is in contact with the pads 73. The pads 73, which have a rectangular plane shape, are wire-bonded with the pads, 31a to 33a, on the sub-mount 25 through the bonding wires $W_2$. The post 62A shows the function of the post 62 in the aforementioned modification shown in FIG. 16; that is, the via metals 72 provide the function same with the post 62 but surrounded with the rectangular block 71 made of insulating material. The distance between the pad 28a of the present modification and the side 25h of the sub-mount 25 may be shorter than the distance $S_1$ between the pads except for the signal pads, 28a to 28c, and the longitudinal side, 25e or 25f, of the sub-mount 25.

Figure 17B:
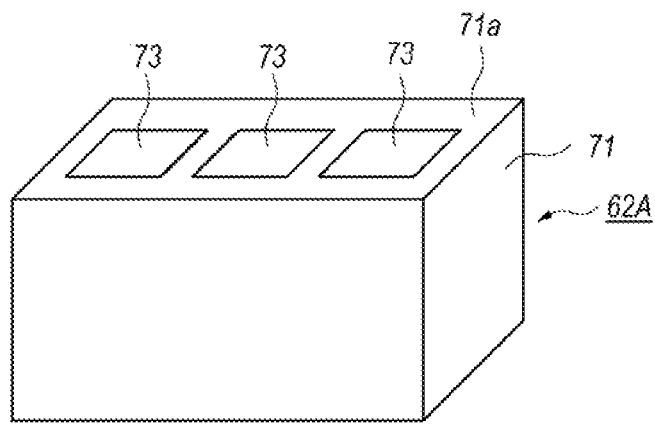
FIG. 17B is a perspective view of the post of the fifth modification.
Figure 17C:
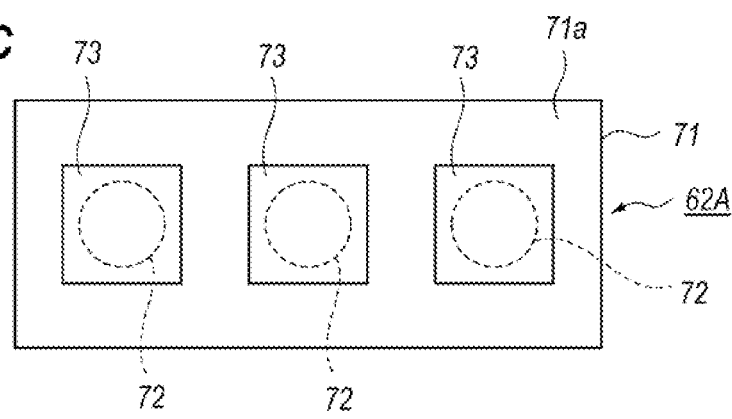
FIG. 17C is a plan view of the post.

FIG. 17B is a perspective view of the post 62A, while FIG. 17C is a plan view thereof. The rectangular block 71, as shown in FIG. 17B and FIG. 17C, provides the via metal 72 and the pads 73, the via metal 72 being in contact with the metal pattern 61 in the signal pads, 28a to 28c. The via metals 72 has a circular cross section with a diameter of preferably 0.1 mm and a span of also preferably 0.1 mm. The via metal 72, in an alternative, may have a rectangular cross section with sides of, for instance, 0.15 mm. Because the signal pads, 28a to 28c, provide the rectangular block 71 with a substantial height, the top level of the signal pads, 28a to 28c, is higher than those of the aforementioned modification, specifically comparable to that of the sub-mount 25, which may shorten the bonding wires $W_2$ pulled therefrom to the signal pads, 31a to 33a, in the sub-mount 25.

Six Modification

Figure 18A:
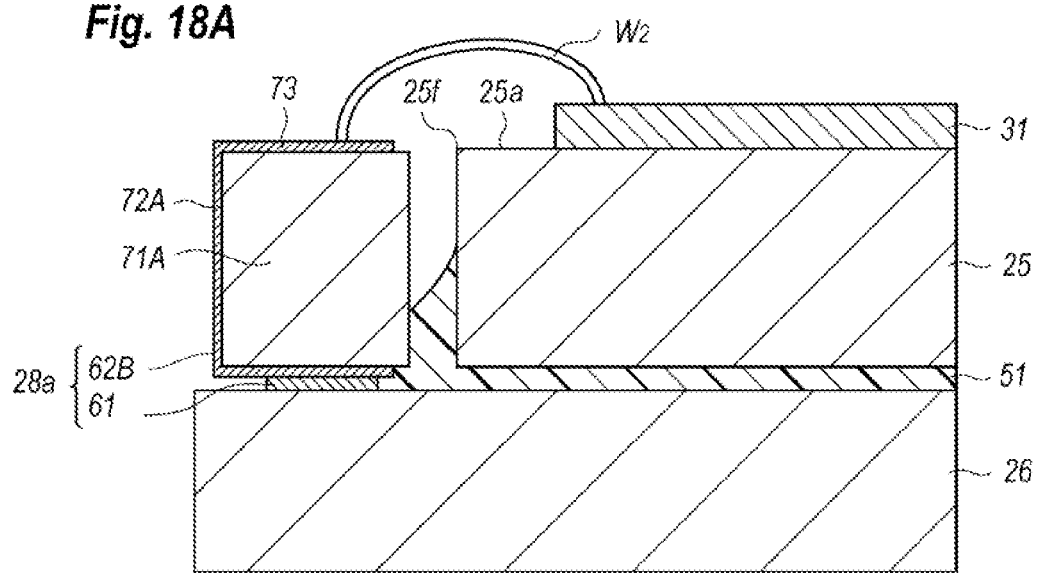
FIG. 18A is a cross sectional view of the signal pads.
Figure 18B:
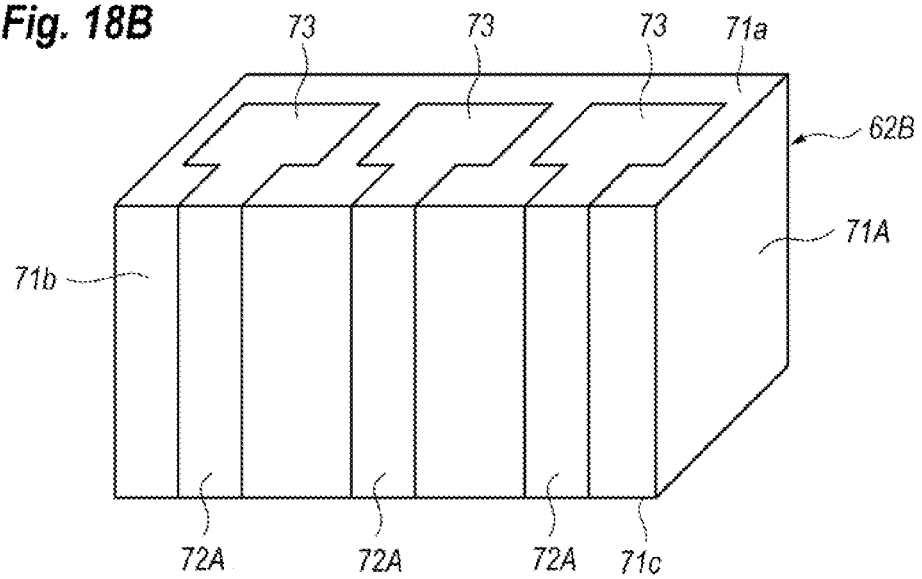
FIG. 18B is a perspective view of the post in the signal pads each according to the sixth modification.

FIG. 18A is a cross sectional view of the signal pads, 28a to 28c, while, FIG. 18B is a perspective view of the modified post 62B in the signal pads, 28a to 28c. The signal pads, 28a to 28c, each provide the metal pattern 61 and a modified post 62B stacked on the metal pattern 61. The post 62B includes the rectangular block 71A and metal patterns 72A formed on a surface of the rectangular block 71A and electrically connected with the metal patterns 61. The metal patterns 72A are fully exposed on the surface of the rectangular block 71A including a top 71a, a side 71b and a bottom 71c thereof, where one end of the metal patterns 72A in the bottom 71c are physically and electrically connected with the metal patterns 61 in the signal pads, 28a to 28c, while, other ends of the metal patterns 72A are wire-bonded with the signal pads, 31a to 33a, in the sub-mount 25 with the bonding wires $W_2$. Because the top level of the signal pads, 28a to 28c, of the present modification, exactly, the top level of the post 62B is substantially equal to the top level of the sub-mount 25, the bonding wires $W_2$ may be shortened. Also, because the post 62B provides the metal patterns 72A in the surface thereof not the inside thereof as those of the previous modification, the metal patterns 72A may be simply formed.

The receiver optical module and the process of assembling the same according to the present invention is not restricted to the embodiment and the modifications thereof thus described; but may include further changes and/or modifications. For instance, the present invention may combine the embodiment and the modifications/changes depending on objects and functions. For instance, the side 25h of the sub-mount 25 is formed in a negative slope, or an overhang, and secures the enough distance $S_2$ against the signal pads, 28a to 28c, of the pre-amplifier 26, which may further prevent the adhesive 51 from spreading on the signal pads, 28a to 28c. Accordingly, the present invention has a scope defined in the claims attached below and all modifications and the changes for elements recited in the claims and equivalents thereto.

What is claimed is:
1. A receiver optical module configured to receive an optical signal and to generate an electrical signal corresponding to the optical signal, comprising:
a photodiode configured to receive the optical signal and generate a photocurrent corresponding to the optical signal;

a sub-mount made of insulating material, the sub-mount mounting the photodiode thereon;

a pre-amplifier configured to generate the electrical signal by receiving the photocurrent, the pre-amplifier mounting the sub-mount accompanying with the photodiode thereon with an adhesive, and having a signal pad and other pads thereon, wherein the signal pad is electrically connected with the photodiode; and a stem that mounts the pre-amplifier accompanying with the sub-mount and the photodiode thereon, the stem providing a lead terminal electrically connected with the pre-amplifier, the electrical signal being externally output through the lead terminal, wherein the signal pad includes a metal pattern on the pre-amplifier and a post on the metal pattern, and wherein the post has a rectangular block with a via hole filled with a metal, the via hole in one of ends thereof electrically connected with the metal pattern on the pre-amplifier and another ends thereof being wire-bonded with the photodiode.

2. The receiver optical module according to claim 1, further including a receptacle that has an axis, the receptacle being configured to receive an external optical fiber providing the optical signal, the external optical fiber being secured in the receptacle along the axis of the receptacle, wherein the photodiode on the pre-amplifier has an optical axis offset from the axis of the receptacle.

3. The receiver optical module according to claim 2, wherein the sub-mount includes a second signal pad wire-bonded with the signal pad, and wherein the second signal pad and the signal pad are disposed in an opposite side of the axis of the receptacle with respective to the optical axis of the photodiode.

4. The receiver optical module according to claim 1, wherein a first distance from the signal pad to the sub-mount is longer than a second distance from the other pads to the sub-mount in a plan view.

5. A receiver optical module configured to receive an optical signal and to generate an electrical signal corresponding to the optical signal, comprising:

a photodiode configured to receive the optical signal and generate a photocurrent corresponding to the optical signal;

a sub-mount made of insulating material, the sub-mount mounting the photodiode thereon;

a mounting member mounting the sub-mount accompanying with the photodiode thereon with an adhesive, and having a signal pad and other pads thereon, wherein the signal pad is electrically connected with the photodiode; and a stem that mounts the mounting member accompanying with the sub-mount and the photodiode thereon, the stem providing a lead terminal electrically connected with the mounting member, the electrical signal being externally output through the lead terminal, wherein the signal pad includes a metal pattern on the mounting member and a post on the metal pattern, and wherein the post has a rectangular block with a via hole filled with a metal, the via hole in one of ends thereof electrically connected with the metal pattern on the mounting member and another ends thereof being wire-bonded with the photodiode.

6. The receiver optical module according to claim 5, further including a receptacle that has an axis, the receptacle being configured to receive an external optical fiber providing the optical signal, the external optical fiber being secured in the receptacle along the axis of the receptacle, wherein the photodiode on the mounting member has an optical axis offset from the axis of the receptacle.

7. The receiver optical module according to claim 6, wherein the sub-mount includes a second signal pad being wire-bonded with the signal pad, and wherein the second signal pad and the signal pad are disposed in an opposite side of the axis of the receptacle with respective to the optical axis of the photodiode.

8. The receiver optical module according to claim 5, wherein a first distance from the signal pad to the sub-mount is longer than a second distance from the other pads to the sub-mount in a plan view.

9. A receiver optical module configured to receive an optical signal and to generate an electrical signal corresponding to the optical signal, comprising:

a photodiode configured to receive the optical signal and generate a photocurrent corresponding to the optical signal;

a sub-mount made of insulating material, the sub-mount mounting the photodiode thereon;

a pre-amplifier configured to generate the electrical signal by receiving the photocurrent, the pre-amplifier mounting the sub-mount accompanying with the photodiode thereon with an adhesive, and having a signal pad and other pads thereon, wherein the signal pad is electrically connected with the photodiode; and a stem that mounts the pre-amplifier accompanying with the sub-mount and the photodiode thereon, the stem providing a lead terminal electrically connected with the pre-amplifier, the electrical signal being externally output through the lead terminal, wherein the signal pad includes a metal pattern on the pre-amplifier and a post on the metal pattern, and wherein the post has a rectangular block including a metal pattern on a top surface, a side surface, and a bottom surface of the rectangular block, the metal pattern on the top surface being wire-bonded with the photodiode, the metal pattern on the bottom surface being physically fixed to and electrically connected with the metal pattern of the pre-amplifier.

10. The receiver optical module according to claim 9, further including a receptacle that has an axis, the receptacle being configured to receive an external optical fiber providing the optical signal, the external optical fiber being secured in the receptacle along the axis of the receptacle, wherein the photodiode on the pre-amplifier has an optical axis offset from the axis of the receptacle.

11. The receiver optical module according to claim 10, wherein the sub-mount includes a second signal pad wire-bonded with the signal pad, and wherein the second signal pad and the signal pad are disposed in an opposite side of the axis of the receptacle with respective to the optical axis of the photodiode.

12. The receiver optical module according to claim 9, wherein a first distance from the signal pad to the sub-mount is longer than a second distance from the other pads to the sub-mount in a plan view.

13. A receiver optical module configured to receive an optical signal and to generate an electrical signal corresponding to the optical signal, comprising:

a photodiode configured to receive the optical signal and generate a photocurrent corresponding to the optical signal;

a sub-mount made of insulating material, the sub-mount mounting the photodiode thereon;

a mounting member mounting the sub-mount accompanying with the photodiode thereon with an adhesive, and having a signal pad and other pads thereon, wherein the signal pad is electrically connected with the photodiode; and a stem that mounts the mounting member accompanying with the sub-mount and the photodiode thereon, the stem providing a lead terminal electrically connected with the mounting member, the electrical signal being externally output through the lead terminal, wherein the signal pad includes a metal pattern on the mounting member and a post on the metal pattern, and wherein the post has a rectangular block including a metal pattern on a top surface, a side surface, and a bottom surface of the rectangular block, the metal pattern on the top surface being wire-bonded with the photodiode, the metal pattern on the bottom surface being physically fixed to and electrically connected with the metal pattern of the pre-amplifier.

14. The receiver optical module according to claim 13, further including a receptacle that has an axis, the receptacle being configured to receive an external optical fiber providing the optical signal, the external optical fiber being secured in the receptacle along the axis of the receptacle, wherein the photodiode on the mounting member has an optical axis offset from the axis of the receptacle.

15. The receiver optical module according to claim 14, wherein the sub-mount includes a second signal pad being wire-bonded with the signal pad, and wherein the second signal pad and the signal pad are disposed in an opposite side of the axis of the receptacle with respective to the optical axis of the photodiode.

16. The receiver optical module according to claim 13, wherein a first distance from the signal pad to the sub-mount is longer than a second distance from the other pads to the sub-mount in a plan view.

\* \* \* \* \*